United States Patent
Kato

(10) Patent No.: US 9,024,514 B2
(45) Date of Patent: May 5, 2015

(54) LIGHT-EMITTING MODULE HAVING CONNECTION MEMBER TO PRESS FOR DIRECT ELECTRICAL CONTACT

(71) Applicant: Toyoda Gosei Co., Ltd., Kiyosu-shi (JP)

(72) Inventor: Hideaki Kato, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/777,852

(22) Filed: Feb. 26, 2013

(65) Prior Publication Data

US 2013/0221827 A1  Aug. 29, 2013

(30) Foreign Application Priority Data

Feb. 27, 2012  (JP) .................................. 2012-039657
Jul. 23, 2012  (JP) .................................. 2012-162880

(51) Int. Cl.

| | |
|---|---|
| *H01L 33/48* | (2010.01) |
| *H01L 33/62* | (2010.01) |
| *H05B 33/06* | (2006.01) |
| *F21V 19/00* | (2006.01) |
| *F21K 99/00* | (2010.01) |
| *F21Y 101/02* | (2006.01) |

(52) U.S. Cl.
CPC .............. *H05B 33/06* (2013.01); *H01L 33/486* (2013.01); *H01L 33/62* (2013.01); *F21K 9/00* (2013.01); *F21V 19/003* (2013.01); *F21Y 2101/02* (2013.01)

(58) Field of Classification Search
CPC ..... H01L 33/486; H01L 33/62; F21V 19/003; F21V 19/004
USPC ......................... 257/99; 313/46, 512; 362/373
See application file for complete search history.

(56) References Cited

U.S. PATENT DOCUMENTS

| | | | |
|---|---|---|---|
| 4,680,593 | A | 7/1987 | Takeno et al. |
| 4,750,260 | A | 6/1988 | Takeno et al. |
| 2005/0024834 | A1 | 2/2005 | Newby |
| 2007/0080438 | A1 | 4/2007 | Yamanaka et al. |
| 2009/0206718 | A1 | 8/2009 | Shimonishi et al. |

(Continued)

FOREIGN PATENT DOCUMENTS

| | | |
|---|---|---|
| JP | S61-167574 A | 7/1986 |
| JP | S63-019885 A | 1/1988 |

(Continued)

OTHER PUBLICATIONS

Detailed Standard Information—JIS C 5603:1993, retrieved from JSA Web Store on Aug. 8, 2014.*

(Continued)

*Primary Examiner* — Anh Mai
*Assistant Examiner* — Steven Horikoshi
(74) *Attorney, Agent, or Firm* — McGinn IP Law Group, PLLC

(57) ABSTRACT

A light-emitting module includes: an LED lamp comprising; a flexible board; and a connection member that sandwiches and fixes the LED lamp and the flexible board. An electrode portion of the flexible board is pressed against an external electrode of the LED lamp by the connection member, whereby the external electrode directly contacts and is electrically connected to the electrode portion. A portion of the connection member highest from the substrate is lower than a portion of the sealing body highest from the substrate.

18 Claims, 29 Drawing Sheets

(56) References Cited

U.S. PATENT DOCUMENTS

| | | |
|---|---|---|
| 2010/0044745 A1* | 2/2010 | Sakai et al. ............ 257/99 |
| 2010/0046232 A1* | 2/2010 | Matsui et al. ............ 362/294 |
| 2012/0026738 A1 | 2/2012 | Oyaizu et al. |

FOREIGN PATENT DOCUMENTS

| | | |
|---|---|---|
| JP | H02-142038 U | 11/1990 |
| JP | 2002-509604 A | 3/2002 |
| JP | 2002-340932 A | 11/2002 |
| JP | 2006-215276 A | 8/2006 |
| JP | 2007-500448 A | 1/2007 |
| JP | 2007-129188 A | 5/2007 |
| JP | 2007-309676 A | 11/2007 |
| JP | 2008-218224 A | 9/2008 |
| JP | 2008-292500 A | 12/2008 |
| JP | 2011-134677 A | 7/2011 |
| JP | 2012-033662 A | 2/2012 |

OTHER PUBLICATIONS

Japanese Office Action dated Nov. 4, 2014 with an English translation thereof.

* cited by examiner

FIG. 12A
FIG. 12B
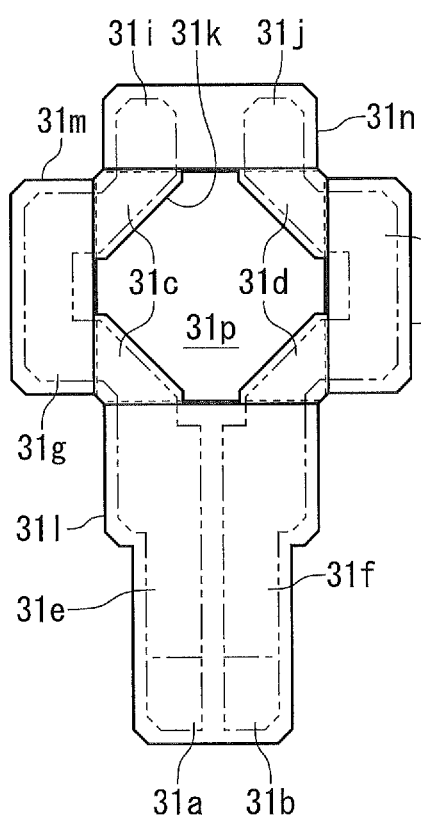
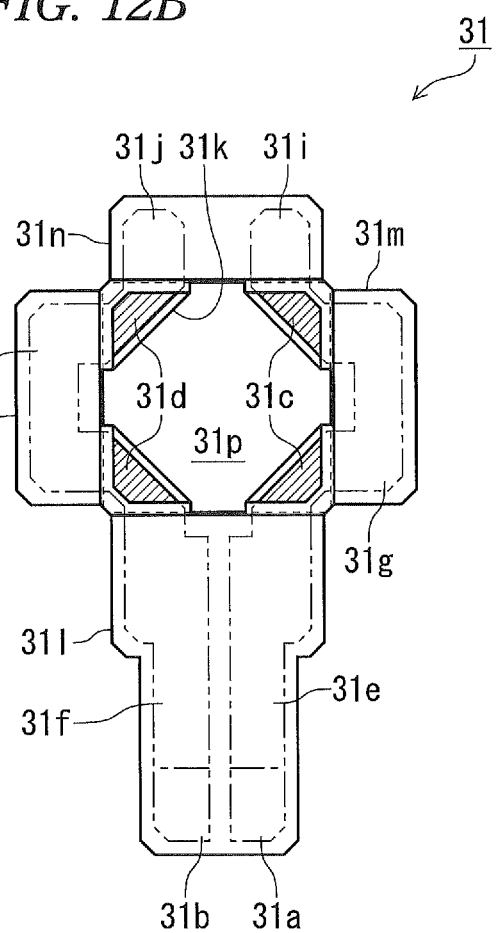

FIG. 18A
FIG. 18B
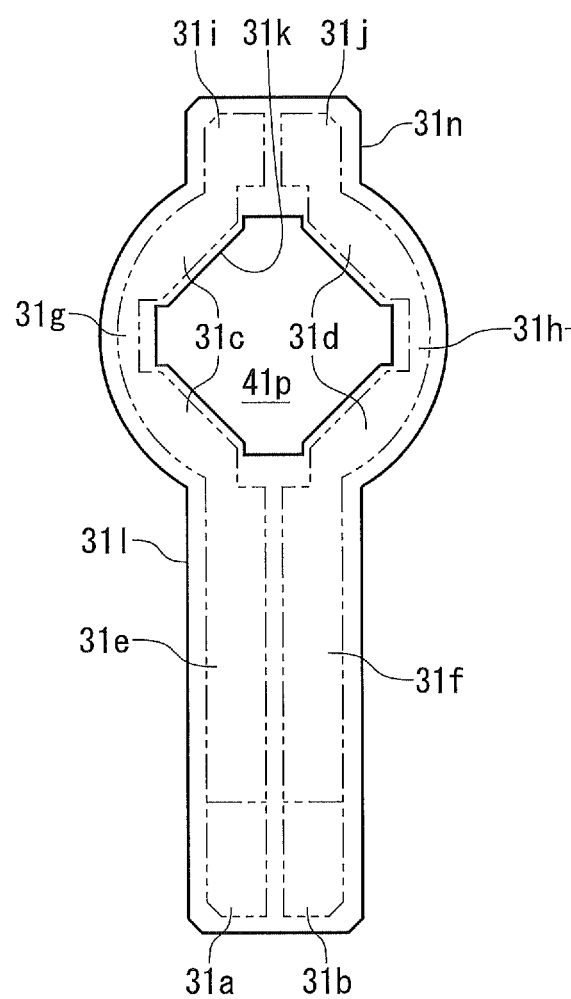
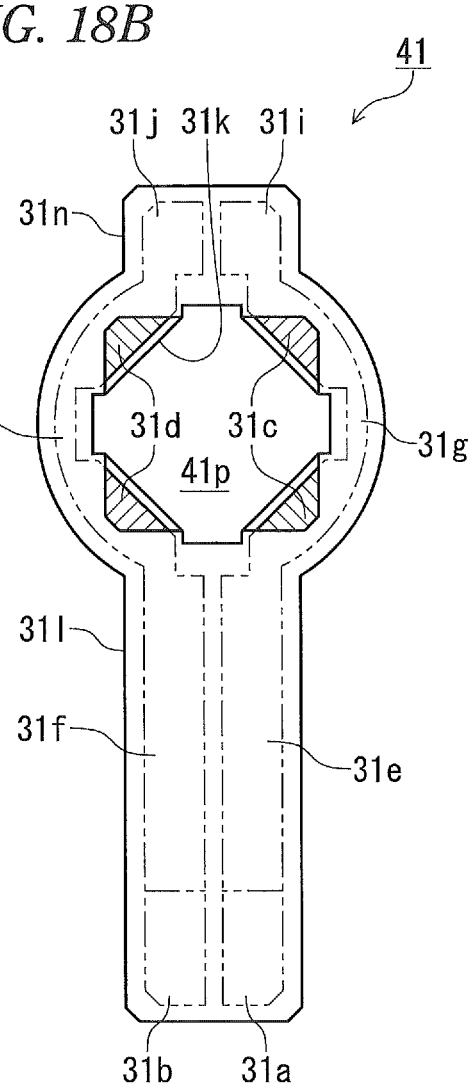

LIGHT-EMITTING MODULE HAVING CONNECTION MEMBER TO PRESS FOR DIRECT ELECTRICAL CONTACT

BACKGROUND

1. Technical Field

The present invention relates to a light-emitting module.

2. Background Art

US 2009/0206718 A1 discloses an LED lamp module which includes a flexible board disposed on a metal base, a surface-mounted LED lamp disposed on the flexible board, and a cover covering the flexible board and the LED lamp, in which the bottom surface of the LED lamp and the flexible board are electrically connected to each other via a conductive member and a light pickup surface is disposed on the surface of the LED lamp, and in which the cover covers a part of the LED lamp other than the light pickup surface and presses the LED lamp.

US 2009/0206718 A1 also discloses that the flexible board is pressed by a protrusion formed on the cover.

US 2009/0206718 A1 also discloses that examples of the conductive member include a metal paste in which metal such as Ag is contained in a resin, soft metal such as Au, and solders such as AuSn, AuGe, and AuSi and that solders which facilitate the bonding process among the materials can be preferably used (see paragraph 0026 of US 2009/0206718 A1).

SUMMARY

In the technique disclosed in US 2009/0206718 A1, when the solders are used as the conductive member, there are problems such as degradation in workability due to soldering, an increase in manufacturing cost, possibility that wiring patterns of the flexible board or electrodes of the LED lamp may be short-circuited by excessive solder, degradation in performance due to thermal stress applied during soldering, and degradation in emission quality due to a solder or a solder flux attached to the light pickup surface of the LED lamp to contaminate the light pickup surface.

In the technique disclosed in US 2009/0206718 A1, when the metal paste or the soft metal is used as the conductive member, there is also a problem in that the workability further degrades in comparison with the solder, thereby increasing the manufacturing cost.

In the technique disclosed in US 2009/0206718 A1, since the cover is disposed at a position higher than LED chips of the LED lamp, there is also a problem in that a shadow of the cover is formed on an irradiated surface irradiated with the light emitted from the LED chips, in addition to a problem in that light emitted from the LED chips may be blocked by the cover and thus emission efficiency of light from the LED chips is lowered.

The invention is made to solve the above-mentioned problems and an object thereof is to provide a light-emitting module which can satisfactorily and simply achieve electrical connection between a flexible board and an LED lamp, which does not block light emitted from LED chips of the LED lamp to prevent degradation in emission quality, and which can be manufactured at low cost.

The inventor intensively studied to solve the above-mentioned problems and finally reached the following aspects of the invention.

Hereinafter, a flexible board (FPC: Flexible Printed Circuits) is defined as follows:

The same types of flexible boards as a flexible printed circuit board, a flex-rigid printed circuit board, a one-sided flexible printed circuit board, a double-sided flexible printed circuit board, and a multi-layered flexible printed circuit board which are defined in JIS C 5603; and flexible flat cables (FFC), that is, flat cables having a structure in which a flat conductor is covered with a flat insulator.

First Aspect

A first aspect of the invention provides a light-emitting module including: an LED lamp including: a substrate, a plurality of LED chips mounted on the substrate, a transparent sealing body that seals the LED chips, and an external electrode disposed on the same plane flush with the LED chips on the substrate and that is connected to the LED chips; a flexible board including an electrode portion; and a connection member that sandwiches and fixes the LED lamp and the flexible board, wherein the electrode portion is pressed against the external electrode by the connection member attached to the flexible board, whereby the external electrode directly contacts and is electrically connected to the electrode portion, and wherein a portion of the connection member highest from the substrate is lower than a portion of the sealing body highest from the substrate.

Accordingly, the first aspect can solve the problems with the conductive member in US 2009/0206718 A1.

In the first aspect, since light emitted from the LED chips of the LED lamp are not blocked by the connection member, it is possible to efficiently emit light from the LED lamp and to prevent a shadow of the connection member from being formed on an irradiated surface irradiated with the emitted light of the LED lamp.

Therefore, according to the first aspect, it is possible to provide a light-emitting module which can satisfactorily and simply achieve electrical connection between a flexible board and an LED lamp, which does not block light emitted from LED chips of the LED lamp to prevent degradation in emission quality, and which can be manufactured at low cost.

Second Aspect

A second aspect of the invention provides the light-emitting module according to the first aspect, wherein the connection member presses a rear side of the electrode portion of the flexible board by an elastic force of the connection member, whereby the electrode portion is urged to the external electrode due to the pressing force.

According to the second aspect, since the electrode portion and the external electrode come in close contact with each other to reduce contact resistance, it is possible to achieve satisfactory electrical connection.

Third Aspect

A third aspect of the invention provides the light-emitting module according to any one of the first and second aspects, further including: a convex portion that protrudes downward from the connection member, wherein a tip of the convex portion presses the rear side of the electrode portion of the flexible board.

According to the third aspect, since the pressing force is concentrated on the tip of the convex portion, it is possible to further enhance the operations and advantages of the second aspect.

The height of the convex portion can be set by experimentally acquiring the optimal height based on the thickness of the flexible board.

Fourth Aspect

A fourth aspect of the invention provides the light-emitting module according to any one of the first and second aspects, further including: a pressing member that is interposed between the connection member and the flexible board, wherein the connection member presses the rear side of the electrode portion of the flexible board through the pressing member.

According to the fourth aspect, since the pressing force is concentrated on the pressing member, it is possible to further enhance the operations and advantages of the second aspect.

The size and shape of the pressing member can be set by experimentally acquiring the optimal size and shape based on the thickness of the flexible board.

Fifth Aspect

A fifth aspect of the invention provides the light-emitting module according to any one of the first to fourth aspects, further including: a sealing frame that surrounds the plurality of LED chips on the substrate, wherein the sealing body is filled in the sealing frame to seal the LED chips, and wherein a portion of the connection member highest from the substrate is lower than a portion of the sealing frame highest from the substrate.

According to the fifth aspect, by adjusting the height position of the sealing frame from the substrate, it is possible to control the emission direction of light from the LED chips.

The portion of the connection member highest from the substrate is lower than the portion of the sealing frame highest from the substrate.

Accordingly, similarly to the first aspect, since the light emitted from the LED chips is not blocked by the connection member, it is possible to efficiently emit light from the LED chips and to prevent the shadow of the connection member from being formed on an irradiated surface irradiated with the light emitted from the LED chips.

Sixth Aspect

A sixth aspect of the invention provides the light-emitting module according to any one of the first to fifth aspects, wherein an end face of the flexible board is flush with or located inside an end face of the connection member in an outside of the LED lamp, such that the flexible board does not protrude from the connection member.

According to the sixth aspect, since the light emitted from the LED lamp is not blocked by the flexible board, it is possible to efficiently emit light from the LED lamp and to prevent the shadow of the flexible board from being formed on an irradiated surface irradiated with the light emitted from the LED lamp.

Seventh Aspect

A seventh aspect of the invention provides the light-emitting module according to any one of the first to sixth aspects, wherein the connection member includes a metal thin plate member.

According to the seventh aspect, since the metal thin plate member has high thermal conductivity, it is possible to dissipate heat generated from the LED chips by transmitting the heat from the external electrode to the outside via the connection member, thereby preventing disorder and enhancing emission quality.

Eighth Aspect

An eighth aspect of the invention provides the light-emitting module according to any one of the first to seventh aspects, further including: a heat-dissipating member that surface-contacts a surface of the substrate opposite to a surface on which the LED chips are mounted.

According to the eighth aspect, since heat generated from the LED chips can be transmitted and dissipated from the substrate to the heat-dissipating member, it is possible to further enhance heat dissipation performance.

Ninth Aspect

A ninth aspect of the invention provides the light-emitting module according to the eighth aspect, wherein a part of the flexible board is bent to cover a portion of the LED lamp other than the sealing body, and wherein the bent portion of the flexible board contacts the heat-dissipating member.

According to the ninth aspect, it is possible to satisfactorily prevent positional misalignment of the flexible board with respect to the LED lamp placed on the heat-dissipating member.

Tenth Aspect

A tenth aspect of the invention provides the light-emitting module according to the ninth aspect, wherein the flexible board further includes a wiring pattern connected to the electrode portion, wherein the wiring pattern is arranged in the bent portion of the flexible board, and wherein the bent portion of the flexible board surface-contacts the heat-dissipating member.

According to the tenth aspect, since heat generated from the LED chips can be transmitted and dissipated from the external electrode to the heat-dissipating member via the wiring pattern, it is possible to further enhance heat dissipation performance.

Eleventh Aspect

An eleventh aspect of the invention provides the light-emitting module according to any one of the first to tenth aspects, wherein unevenness is formed on a surface of the electrode portion by a dimpling process.

According to the eleventh aspect, since contact resistance between the external electrode and the electrode portion is reduced, it is possible to more satisfactorily achieve the electrical connection therebetween.

Twelfth Aspect

A twelfth aspect provides the light-emitting module according to any one of the first to eleventh aspects, wherein the flexible board is a flexible flat cable.

BRIEF DESCRIPTION OF THE DRAWINGS

FIG. 12A is a top view of a flexible board 31 of the light-emitting module 30, and FIG. 12B is a bottom view of the flexible board 31;

FIG. 18A is a top view of a flexible board 41 of the light-emitting module 40, and FIG. 18B is a bottom view of the flexible board 41;

DETAILED DESCRIPTION

Figure 1A:
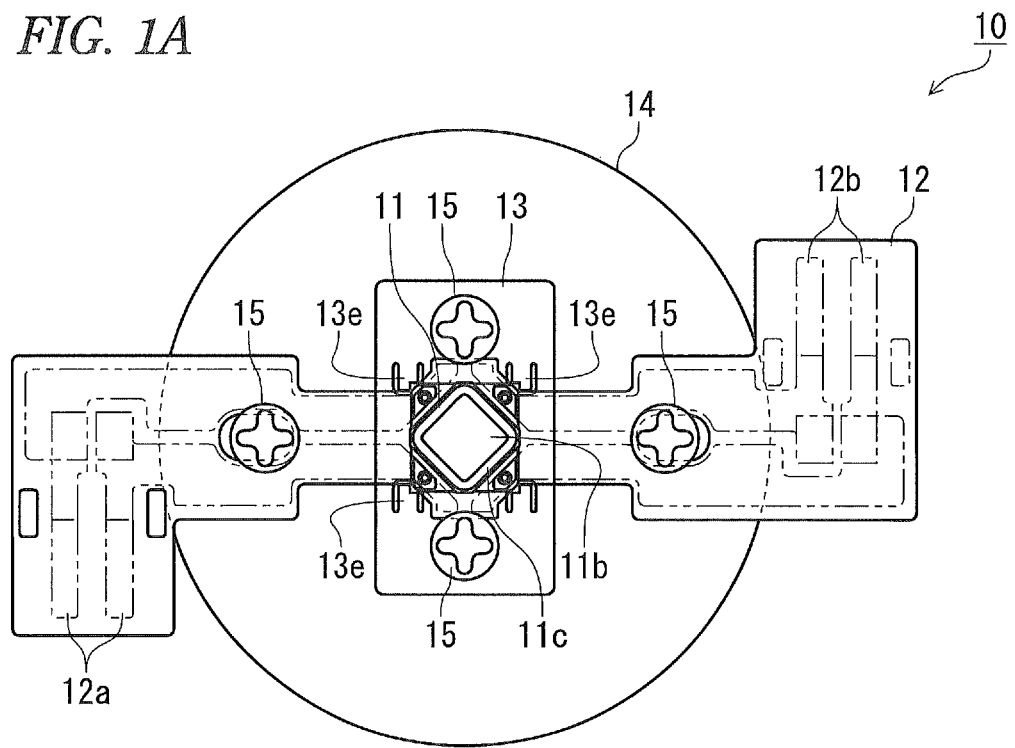
FIG. 1A is a partial transparent top view of a light-emitting module 10 according to a first embodiment of the invention.

Hereinafter, embodiments of the invention will be described with reference to the accompanying drawings. In the embodiments, the same constituent members and elements will be referenced by the same reference numerals and description thereof will not be repeated.

First Embodiment

As shown in FIGS. 1A and 1B to FIG. 6, a light-emitting module 10 according to a first embodiment of the invention includes an LED lamp 11 (an insulating substrate 11a, a light-emitting section 11b, a sealing frame 11c, a sealing body 11d, LED chips 11e, and external electrodes 11f and 11g), a flexible board 12 (electrode portions 12a to 12d, wiring patterns 12e and 12f, a mounting hole 12g, and screw holes 12h and 12i), a connection member 13 (a mounting hole 13a, screw holes 13b and 13c, convex portions 13d, and locking claws 13e), a chassis 14 (female screw holes 14a to 14d), and male screws 15.

The chassis 14 is, for example, a heat sink or a case of a light-emitting device on which the light-emitting module 10 is mounted.

Figure 2A:
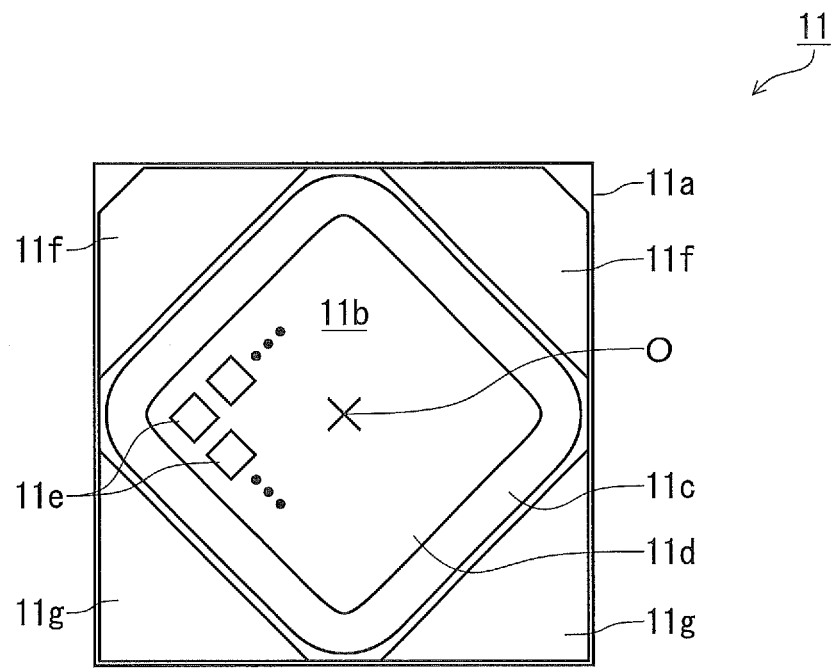
FIG. 2A is a top view of an LED lamp 11 of the light-emitting module 10.
Figure 2B:
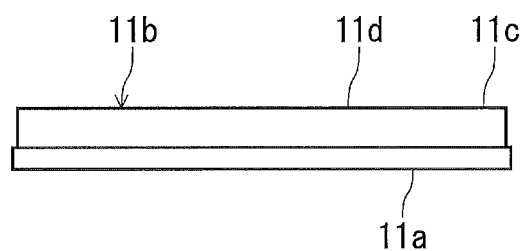
FIG. 2B is a front view of the LED lamp 11.

As shown in FIGS. 2A and 2B, the LED lamp (LED board) 11 includes the insulating substrate 11a, the light-emitting section 11b, the sealing frame 11c, the sealing body 11d, the LED chips 11e, and the external electrodes 11f and 11g.

The insulating substrate 11a has a square plate shape of which both surfaces are flat and the light-emitting section 11b has a square flat shape of which four corners are rounded. The light-emitting section 11b is disposed on the insulating substrate 11a, in a state where the insulating substrate 11a and the light-emitting section 11b are superimposed with central axes O thereof matched with each other and the light-emitting section 11b is disposed to rotate by about 45° with respect to the insulating substrate 11a.

The sealing frame 11c has a rectangular frame shape (picture frame shape) of which four corners are rounded, a sealed region filled with the sealing body 11d is formed in the inside surrounded with the sealing frame 11c, and the sealed region is the light-emitting section 11b.

In the light-emitting section 11b, plural LED chips 11e are arranged in a grid pattern with gaps therebetween. In FIGS. 2A and 2B, only three LED chips 11e are illustrated.

The LED chips 11e are mounted on the insulating substrate 11a and are embedded in and sealed with the transparent sealing body 11d.

In other words, the sealing frame 11c is disposed on the outer peripheral edge of the light-emitting section 11b, and the sealing frame 11c surrounds plural LED chips 11e on the insulating substrate 11a.

The surface of the light-emitting section 11b serves as a light-emitting surface of the LED lamp 11.

The external electrodes 11f and 11g are disposed at two positions of four corners which are triangular areas outside the sealing frame 11c on the insulating substrate 11a.

The LED chips 11e are connected to a wiring pattern (not shown) formed of a wiring layer formed on the insulating substrate 11a to construct a circuit, and portions of the wiring pattern exposed from the insulating substrate 11a become the external electrodes 11f and 11g. In other words, the LED chips 11e and the external electrodes 11f and 11g are connected to each other via the wiring pattern having the external electrodes 11f and 11g as parts thereof.

Here, the insulating substrate 11a includes a substrate formed of a bulk insulating material of aluminum nitride or the like or a substrate in which an insulating layer is formed on the surface of a metal material of aluminum or the like.

The sealing frame 11c is formed of a synthetic resin and the sealing body 11d is formed of a silicon resin containing a fluorescent material.

Figure 3:
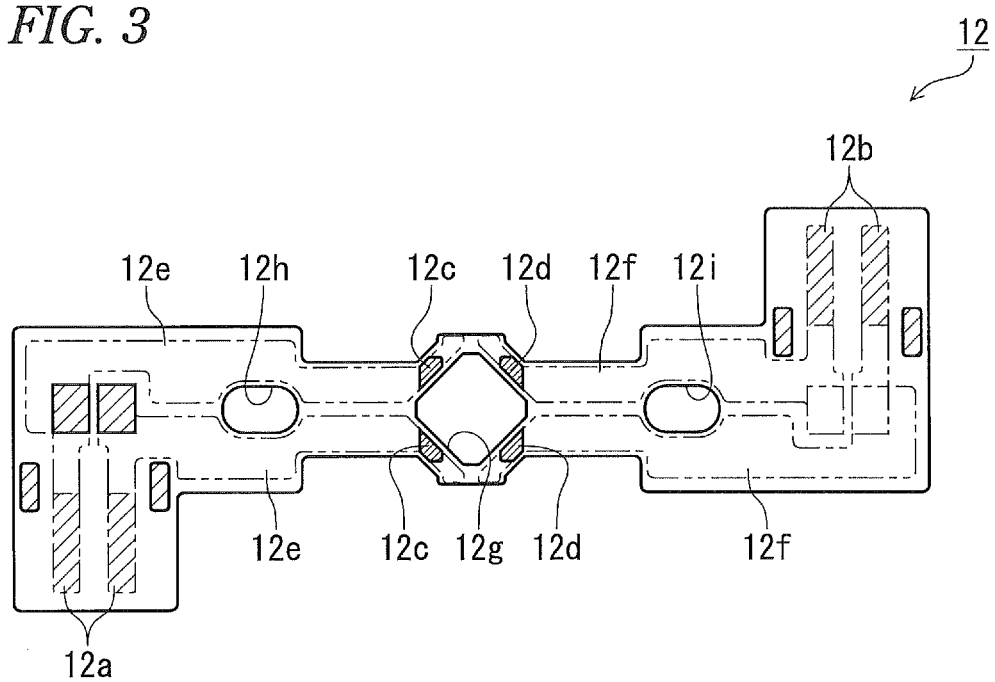
FIG. 3 is a top view of a flexible board 12 of the light-emitting module 10.

As shown in FIG. 3, the flexible board 12 includes the electrode portions (connection portions) 12a to 12d, wiring patterns 12e and 12f, the mounting hole 12g, and the screw holes 12h and 12i.

The electrode portions 12a and 12b are disposed in both end portions in the length direction of the flexible board 12 which is a sheet-like long member, the mounting hole 12g is formed through the central portion in the length direction of the flexible board 12, the electrode portions 12c and 12d are disposed outside the sides of the mounting hole 12g having a substantially square shape, and the screw holes 12h and 12i are formed through the substantially central portions between the electrode portions 12a and 12b and the electrode portions 12c and 12d.

The flexible board 12 has a structure in which a metal foil (for example, a copper foil) having high conductivity is interposed between flexible film members formed of a synthetic resin (such as polyimide, liquid crystal polymer, and crystalline polymer) having an insulating property.

The electrode portions 12a to 12d are constructed by portions obtained by removing the flexible film member on the rear side of the flexible board 12 to expose the metal foil.

That is, the surface side of the flexible board 12 shown in FIG. 3 is covered with the flexible film member and the electrode portions 12a to 12d are formed on the rear side of the flexible board 12.

The wiring patterns 12e and 12f are formed of a metal foil, the wiring pattern 12e connects the electrode portion 12a and the electrode portion 12c to each other, and the wiring pattern 12f connects the electrode portion 12b and the electrode portion 12d to each other.

In the electrode portions 12a to 12d, the surface of the metal foil may be plated with various metals (such as nickel and gold) so as to prevent an increase in contact resistance due to corrosion of the exposed metal foil.

In the example shown in FIG. 3, since a transparent flexible film member is used, the electrode portions 12a to 12d and the wiring patterns 12e and 12f are seen through the flexible film member.

Figure 4A:
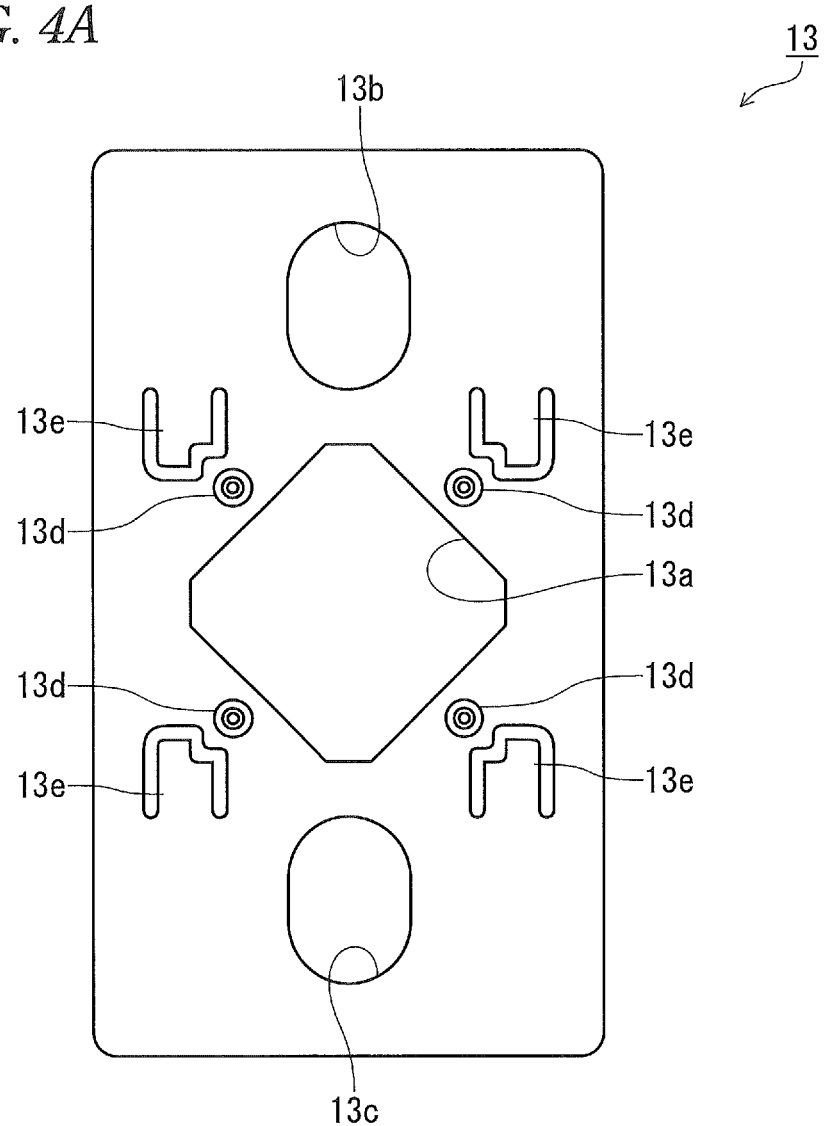
FIG. 4A is a top view of a connection member 13 of the light-emitting module 10.
Figure 4B:
FIG. 4B is a front view of the connection member 13.

As shown in FIGS. 4A and 4B, the connection member 13 includes the mounting hole 13a, the screw holes 13b and 13c, the convex portions 13d, and the locking claws 13e, and is formed by performing a pressing process on a thin plate member (for example, a metal plate such as a stainless steel plate, a phosphor-bronze plate, a copper plate, and a brass plate and a synthetic resin plate) having high elasticity.

The mounting hole 13a is formed at the central portion of the rectangular connection member 13, the screw holes 13b and 13c are formed on both sides of the mounting hole 13a in the length direction of the connection member 13, four convex portions 13d having a substantially conical shape protruding to the rear side of the connection member 13 are formed in the vicinity of the sides of the substantially square mounting hole 13a, and the locking claws 3e cut in a substantially C-shape in the connection member 13 are formed outside the convex portions 13d.

Figure 5A:
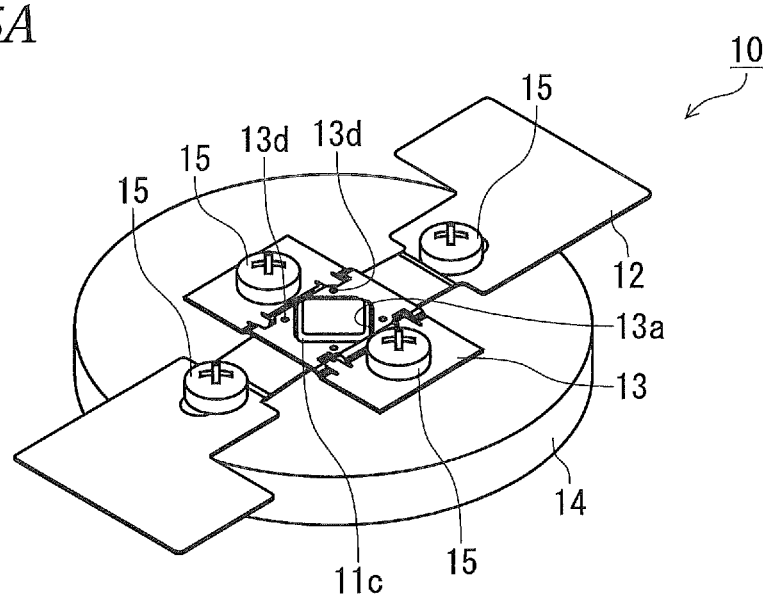
FIG. 5A is a perspective view of the light-emitting module 10.
Figure 5B:
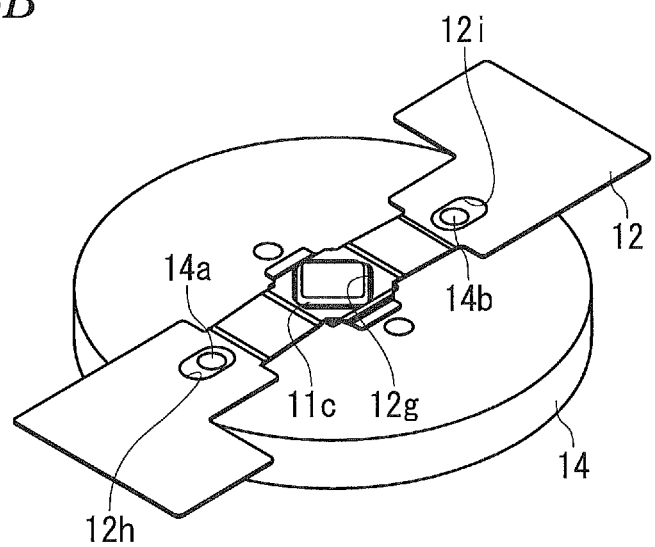
FIG. 5B is a perspective view illustrating a state where the LED lamp 11 and the flexible board 12 are placed on a chassis 14 of the light-emitting module 10.
Figure 5C:
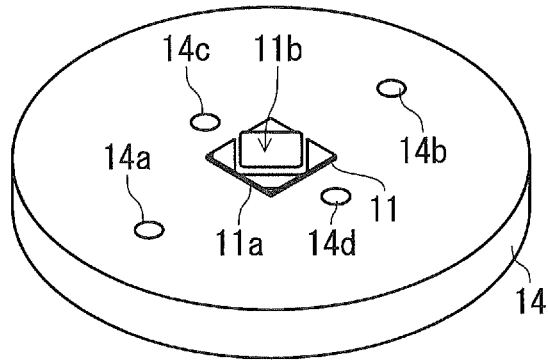
FIG. 5C is a perspective view illustrating a state where the LED lamp 11 is placed on the chassis 14.

As shown in FIG. 5C, the female screw holes 14a to 14d are formed in the flat surface of the chassis 14.

As shown in FIG. 5C, in the chassis 14, the female screw holes 14a and 14b are arranged in a straight line, the female screw holes 14c and 14d are arranged in a straight line, and the straight line in which the female screw holes 14a and 14b are arranged and the straight line in which the female screw holes 14c and 14d are arranged are perpendicular to each other.

Method of Assembling Light-emitting Module 10

A method of assembling the light-emitting module 10 will be described with reference to FIGS. 1A and 1B to FIG. 6.

First, as shown in FIG. 5C, the LED lamp 11 is placed on the surface of the chassis 14 in such a way that the light-emitting section 11b faces the upside.

Here, when a mirror-like finishing process is performed on the surface of the chassis 14 to smooth the surface, the bottom surface of the insulating substrate 11a of the LED lamp 11 closely adheres to the surface of the chassis 14 and comes in surface contact therewith and it is thus possible to efficiently transmit heat generated from the LED lamp 11 to the chassis 14 and to dissipate the heat.

When a heat-dissipating grease (not shown) is applied to the surface of the chassis 14 and the LED lamp 11 is placed on the heat-dissipating grease, it is possible to temporarily fix the LED lamp 11 to the chassis 14 and to enhance the heat dissipation performance because the surface of the chassis 14 and the rear surface of the insulating substrate 11a come in surface contact with each other.

As shown in FIG. 5B, in a state where the screw holes 12h and 12i of the flexible board 12 are matched with the female screw holes 14a and 14b of the chassis 14, the flexible board 12 is placed on the chassis 14 in such as way that the sealing frame 11c of the LED lamp 11 is fitted to the mounting hole 12g of the flexible board 12 and the electrode portions 12a to 12d face the downside.

Then, two electrode portions 12c of the flexible board 12 and two external electrodes 11f of the LED lamp 11 come in contact with each other, two electrode portions 12d of the flexible board 12 and two external electrodes 11g of the LED lamp 11 come in contact with each other, and they are electrically connected to each other.

Since the size and shape of the electrode portions 12c and 12d of the flexible board 12 are substantially the same as the size and shape of the external electrodes 11f and 11g of the LED lamp 11, the entire surfaces of the electrode portions 12c and 12d come in contact with the entire surfaces of the external electrodes 11f and 11g, thereby reducing the contact resistance therebetween.

When the mounting hole 12g is formed to be slightly larger than the sealing frame 11c, the sealing frame 11c is fitted into the mounting hole 12g substantially without any gap and thus the electrode portions 12c and 12d can be prevented from causing positional misalignment with the external electrodes 11f and 11g, thereby satisfactorily bringing them in contact with each other.

Subsequently, as shown in FIG. 5A, in a state where the screw holes 13b and 13c of the connection member 13 and the female screw holes 14c and 14d of the chassis 14 are matched with each other, the connection member 13 is placed on the chassis 14 so that the convex portions 13d face the upside and the sealing frame 11c of the LED lamp 11 is fitted into the mounting hole 13a of the connection member 13.

The male screws 15 are inserted into the screw holes 12h, 12i, 13b, and 13c from the upside of the connection member 13 and the male screws 15 are screwed into the female screw holes 14a to 14d.

As a result, the LED lamp 11 and the flexible board 12 are sandwiched and fixed between the chassis 14 and the connection member 13.

Then, since four convex portions 13d protruding downward from the connection member 13 press the flexible film member located on the rear side of the electrode portions 12c and 12d of the flexible board 12 and the electrode portions 12c and 12d are urged to the external electrodes 11f and 11g of the LED lamp 11 due to the pressing force thereof, the electrode portions 12c and 12d and the external electrodes 11f and 11g come in close contact with each other, thereby reducing the contact resistance therebetween.

At this time, since both end portions in the length direction of the connection member 13 are mounted on and fixed to the chassis 14 through the use of the male screws 15 and the central portion of the connection member 13 is attached to the insulating substrate 11a of the LED lamp 11, both end portions in the length direction of the connection member 13 are lowered and the central portion thereof is raised.

Accordingly, since the connection member 13 is slightly elastically deformed and a stress due to the elastic deformation is applied as a pressing force of the convex portions 13d, the electrode portions 12c and 12d and the external electrodes 11f and 11g can be electrically connected to each other more satisfactorily.

Figure 6:
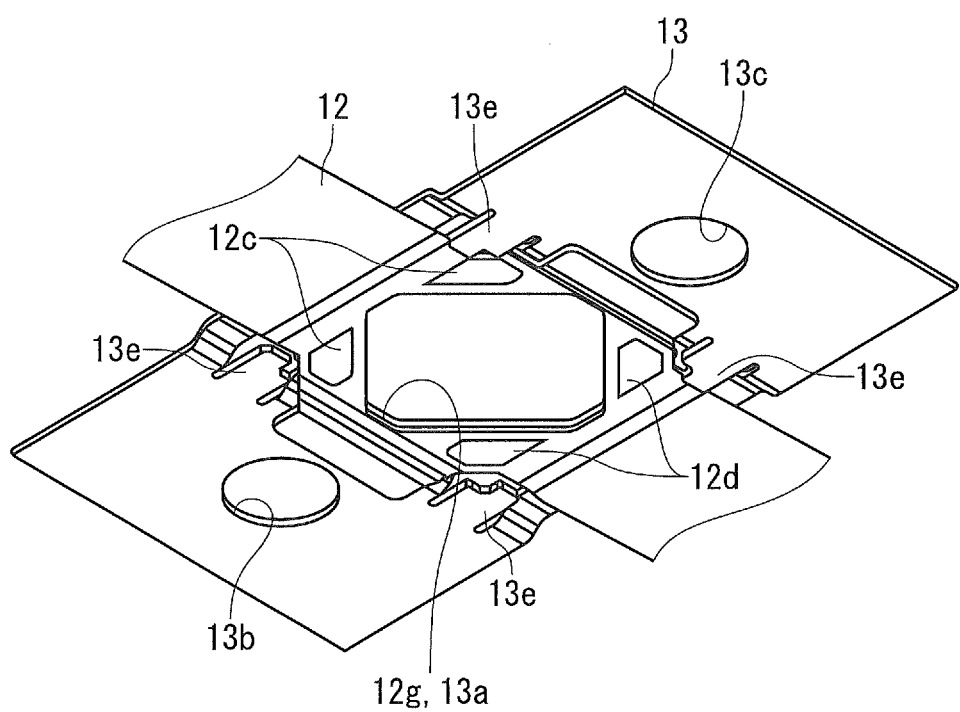
FIG. 6 is a partial perspective view of the flexible board 12 and the connection member 13 when seen from the lower side to illustrate the assembled state of the light-emitting module 10.

As shown in FIG. 6, the connection member 13 warps and thus the locking claws 13e protrude from the connection member 13.

Figure 1B:
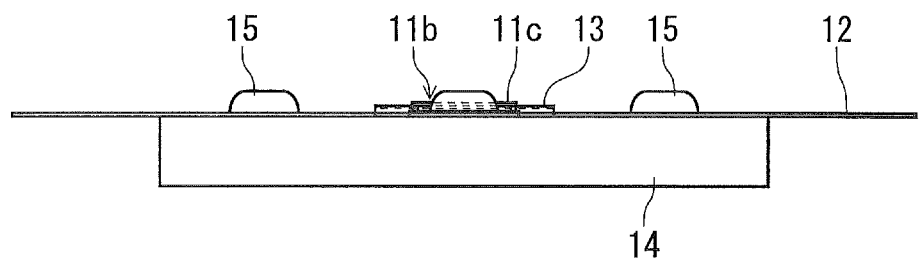
FIG. 1B is a front view of the light-emitting module 10.

Accordingly, as shown in FIGS. 1A and 1B, since four locking claws 13e come in contact with the outer peripheral ends of four sides of the insulating substrate 11a of the LED lamp 11, the connection member 13 can be prevented from causing positional misalignment with the LED lamp 11, thereby satisfactorily holding and fixing the connection member 13.

When the mounting hole 13a of the connection member 13 is formed to be slightly larger than the sealing frame 11c of the LED lamp 11, the sealing frame 11c is fitted into the mounting hole 13a substantially without any gap therebetween and it is thus possible to further satisfactorily prevent the connection member 13 from causing positional misalignment with the LED lamp 11.

In the chassis 14, the straight line in which the female screw holes 14a and 14b are arranged and the straight line in which the female screw holes 14c and 14d are arranged are perpendicular to each other.

Accordingly, the LED lamp 11, the flexible board 12, and the connection member 13 can be prevented from causing positional misalignment with the chassis 14, thereby satisfactorily fixing them.

When using the light-emitting module 10 assembled in this way, a power supply cable of a DC power source is connected to the electrode portions 12a and 12b of the flexible board 12 and a DC voltage is applied to the external electrodes 11f and 11g of the LED lamp 11 via the wiring patterns 12e and 12f and the electrode portions 12c and 12d from the electrode portions 12a and 12b, whereby DC power is supplied to the LED chips 11e to turn on the LED chips.

Operations and Advantages of First Embodiment

The following operations and advantages can be obtained from the light-emitting module 10 according to the first embodiment.

(1) The LED lamp 11 and the flexible board 12 are sandwiched and fixed between the chassis 14 and the connection member 13.

The electrode portions 12c and 12d of the flexible board 12 are pressed against the external electrodes 11f and 11g of the LED lamp 11 by the connection member 13 attached to the flexible board 12, and the external electrodes 11f and 11g and the electrode portions 12c and 12d come in direct contact with each other and are electrically connected to each other.

Therefore, the light-emitting module 10 can solve the problems with the conductive member of US 2009/0206718 A1.

(2) As shown in FIG. 1B, the connection member 13 is lower than the sealing frame 11c of the LED lamp 11 in the height direction of the light-emitting module 10.

That is, the highest portion of the connection member 13 from the surface (the insulating substrate 11a of the LED lamp 11) of the chassis 14 is lower than the highest portion of the sealing frame 11c from the surface of the chassis 14.

Accordingly, since the emitted light of the LED lamp 11 (the LED chips 11e) is not blocked by the connection member 13, it is possible to efficiently emit light from the LED lamp 11 and to prevent a shadow of the connection member 13 from being formed on an irradiated surface irradiated with the emitted light of the LED lamp 11.

(3) The connection member 13 presses the flexible film member located on the rear side of the electrode portions 12c and 12d of the flexible board 12 by the use of the elastic force of the connection member 13 and the electrode portions 12c and 12d are urged to the external electrodes 11f and 11g of the LED lamp 11 by the use of the pressing force. Accordingly, the electrode portions 12c and 12d come in close contact with the external electrodes 11f and 11g to reduce the contact resistance therebetween, thereby satisfactorily achieving the electrical connection therebetween.

(4) Four convex portions 13d having a substantially conical shape and protruding downward are formed in the connection member 13 and the tips of the convex portions 13d press the flexible film member located on the rear side of the electrode portions 12c and 12d of the flexible board 12. Accordingly, since the pressing force is concentrated on the tips of the convex portions 13d, it is possible to further enhance the operation and advantage of (3).

The height of the convex portions 13d can be set by experimentally acquiring the optimal height depending on the thickness of the flexible board 12.

(5) The sealing frame 11e of the LED lamp 11 is formed on the insulating substrate 11a to surround plural LED chips 11e. The sealing body 11d is filled in the sealing frame 11c to seal the LED chips 11e.

Accordingly, by adjusting the height position of the sealing frame 11c from the insulating substrate 11a, it is possible to control the emission direction of light from the LED chips 11e.

(6) The end face of the mounting hole 12g of the flexible board 12 is flush with the end face of the mounting hole 13a of the connection member 13, or the end face of the mounting hole 12g is located inside the end face of the mounting hole 13a, and the flexible board 12 does not protrude from the mounting hole 13a of the connection member 13.

Accordingly, since the emitted light of the LED lamp 11 is not blocked by the flexible board 12, it is possible to efficiently emit light from the LED lamp 11 and to prevent a shadow of the flexible board 12 from being formed on an irradiated surface irradiated with the emitted light of the LED lamp 11.

(7) When the connection member 13 is formed of a material (such as a metal thin plate member) having high thermal conductivity, it is possible to dissipate heat generated from the LED chips 11e by transmitting the generated heat from the external electrodes 11f and 11g of the insulating substrate 11a to the chassis 14 via the connection member 13 and thus to prevent the overheating of the LED chips 11e, thereby preventing disorder and enhancing emission quality.

(8) The top surface of the chassis 14 (heat-dissipating member) comes in surface contact with the rear surface (the opposite surface to the surface on which the LED chips 11e are mounted) of the insulating substrate 11a of the LED lamp 11.

Accordingly, since heat generated from the LED chips 11e can be dissipated by transmitting the heat from the rear surface of the insulating substrate 11a to the chassis 14, it is possible to further enhance heat dissipation performance.

(9) When the connection member 13 is formed of a material having high light reflectivity or is subjected to a process (such as a plating process) for enhancing the light reflectivity to enhance the light reflectivity of the surface of the connection member 13, a part of the emitted light of the LED lamp 11 is reflected by the connection member 13 and it is thus possible to enhance the emission efficiency of the light-emitting module 10.

(10) By means of (1) to (9) described above, it is possible to provide a low-cost light-emitting module 10 which can satisfactorily and simply achieve electrical connection between the flexible board 12 and the LED lamp 11, which does not block light emitted from the LED chips 11e of the LED lamp 11, and which can prevent degradation in emission quality.

(11) US 2009/0206718 A1 discloses that the cover presses the LED lamp, but this pressing is intended for enhancement in heat dissipation performance due to bringing the LED lamp into close contact with the metal base. It is neither disclosed nor taught that the pressing is associated with the electrical connection between the LED lamp and the flexible board (see paragraphs 0007, 0020, and 0025).

US 2009/0206718 A1 discloses that the protrusions formed on the cover press the flexible board, but this pressing is intended for prevention of positional misalignment of the flexible board. It is neither disclosed nor taught that the pressing is associated with the electrical connection between the LED lamp and the flexible board (see paragraphs 0020 and 0025).

US 2009/0206718 A1 discloses only the configuration for electrically connecting the LED lamp and the flexible board through the use of the conductive member, but neither discloses nor teaches the configuration for directly connecting the LED lamp and the flexible board with the conductive member removed.

Therefore, even a person skilled in the art would have difficulty in thinking out the configuration of (1) on the basis of US 2009/0206718 A1 and would not be able to predict the operation and advantage of (1).

Second Embodiment

As shown in FIGS. 7A and 7B to FIG. 10, a light-emitting module 20 according to a second embodiment of the invention includes an LED lamp 21 (a sealing body 11d, LED chips 11e, an insulating substrate 21a, a light-emitting section 21b, a sealing frame 21c, notched portions 21d and 21e, external electrodes 21f and 21g, a screw hole 21h, and mounting concave portions 21i to 21l), flexible boards 22a and 22b (electrode portions 22c and 22d, wiring patterns 22e, and mounting concave portions 22f and 22g), a connection member 23 (screw holes 23c, convex portions 23d, and locking claws 23e and 23f), a chassis 14, and male screws 15.

Figure 8A:
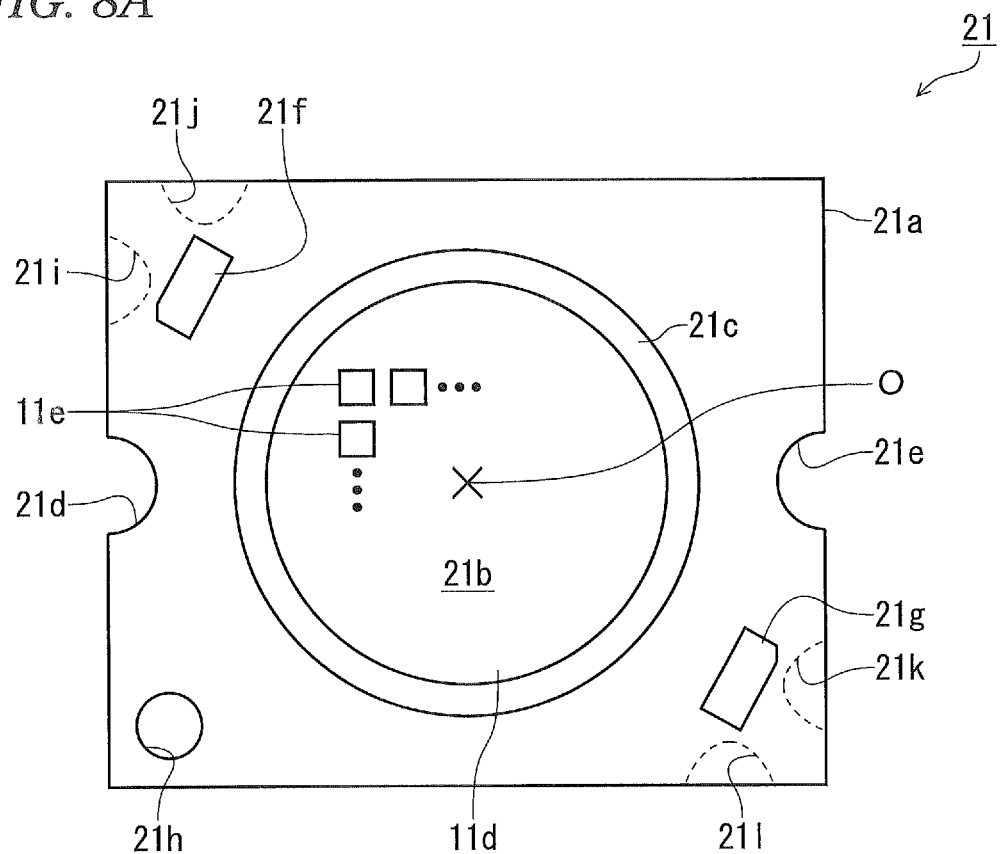
FIG. 8A is a top view of an LED lamp 21 of the light-emitting module 20.
Figure 8B:
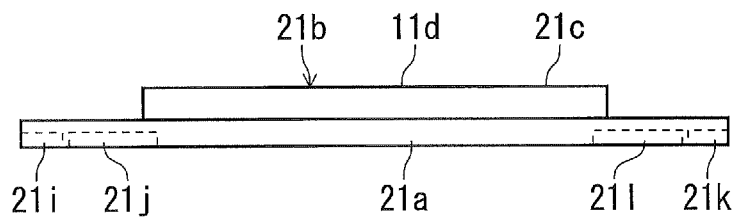
FIG. 8B is a front view of the LED lamp 21.

As shown in FIGS. 8A and 8B, the LED lamp (LED board) 21 includes the sealing body 11d, the LED chips 11e, the insulating substrate 21a, the light-emitting section 21b, the sealing frame 21c, the external electrodes 21f and 21g, the screw hole 21h, and the mounting concave portions 21i to 21l.

The insulating substrate 21a has a square plate shape of which both surfaces are flat and the light-emitting section 21b has a circular flat shape. The light-emitting section 21b is disposed on the insulating substrate 21a, in a state where the insulating substrate 21a and the light-emitting section 21b are superimposed with central axes O thereof matched with each other.

Similarly to the insulating substrate 11a, the insulating substrate 21a includes a substrate formed of a bulk insulating material of aluminum nitride or the like or a substrate in which an insulating layer is formed on the surface of a metal material of aluminum or the like.

The sealing frame 21c has a circular frame shape (doughnut shape), a sealed region filled with the sealing body 11d is formed in the inside surrounded with the sealing frame 21c, and the sealed region is the light-emitting section 21b.

The sealing frame 21c is formed of a synthetic resin, similarly to the sealing frame 11c.

In the light-emitting section 21b, plural LED chips 11e are arranged in a grid pattern with gaps therebetween. In FIGS. 8A and 8B, only three LED chips 11e are illustrated.

The LED chips 11e are mounted on the insulating substrate 21a and are embedded in and sealed with the transparent sealing body 11d.

In other words, the sealing frame 21c is disposed on the outer peripheral edge of the light-emitting section 21b, and the sealing frame 21c surrounds plural LED chips 11e on the insulating substrate 21a.

The surface of the light-emitting section 21b serves as a light-emitting surface of the LED lamp 21.

The external electrodes 21f and 21g are disposed in diagonal portions outside the sealing frame 21c on the insulating substrate 21a.

The LED chips 11e are connected to a wiring pattern (not shown) formed of a wiring layer formed on the insulating substrate 21a to construct a circuit, and portions of the wiring pattern exposed from the insulating substrate 21a become the external electrodes 21f and 21g. In other words, the LED chips 11e and the external electrodes 21f and 21g are connected to each other via the wiring pattern having the external electrodes 21f and 21g as parts thereof.

The notched portions 21d and 21e having a shape in which the end face of the insulating substrate 21a is cut out in a semicircular shape are formed on two opposing sides of the insulating substrate 21a.

The screw hole 21h is formed to penetrate a corner of the insulating substrate 21a.

On the rear side of the insulating substrate 21a, the mounting concave portions 21i and 21j having a shape in which the end face of the insulating substrate 21a is cut out in a semicircular shape are formed in two sides in the vicinity of the external electrode 21f.

On the rear side of the insulating substrate 21a, the mounting concave portions 21k and 21l having a shape in which the end face of the insulating substrate 21a is cut out in a semicircular shape are formed in two sides in the vicinity of the external electrode 21g.

Figure 9:
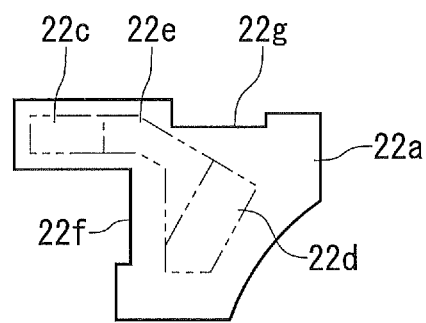
FIG. 9 is a top view of flexible boards 22a and 22b of the light-emitting module 20.
Figure 9:
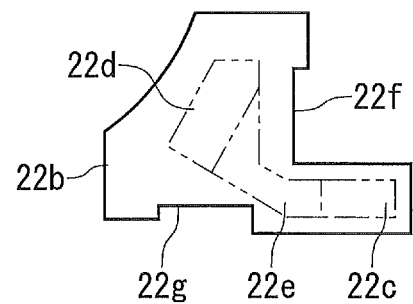

As shown in FIG. 9, the flexible boards 22a and 22b have the same structure and include the electrode portions (connection portions) 22c and 22d and the wiring pattern 22e.

Similarly to the flexible board 12, the flexible boards 22a and 22b have a structure in which a metal foil having high conductivity is interposed between flexible film members formed of a synthetic resin having an insulating property.

The electrode portions 22c and 22d are constructed by portions obtained by removing the flexible film member on the rear side of the flexible boards 22a and 22b to expose the metal foil.

That is, the surface sides of the flexible boards 22a and 22b shown in FIG. 9 are covered with the flexible film members and the electrode portions 22c and 22d are formed on the rear sides of the flexible boards 22.

The wiring pattern 22e is formed of a metal foil, and the wiring pattern 22e connects the electrode portions 22c and 22d to each other.

The mounting concave portions 22f and 22g are formed in the flexible boards 22a and 22b.

In the electrode portions 22c and 22d, the surface of the metal foil may be subjected to a plating process so as to prevent an increase in contact resistance due to corrosion of the exposed metal foil.

In the example shown in FIG. 9, since a transparent flexible film member is used, the electrode portions 22c and 22d and the wiring pattern 22e are seen through the flexible film member.

Figure 10A:
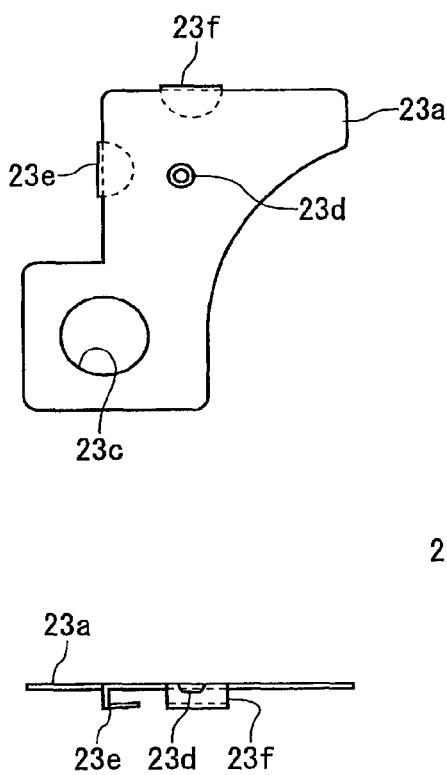
FIG. 10A is a top view of connection members 23a and 23b of the light-emitting module 20.
Figure 10B:
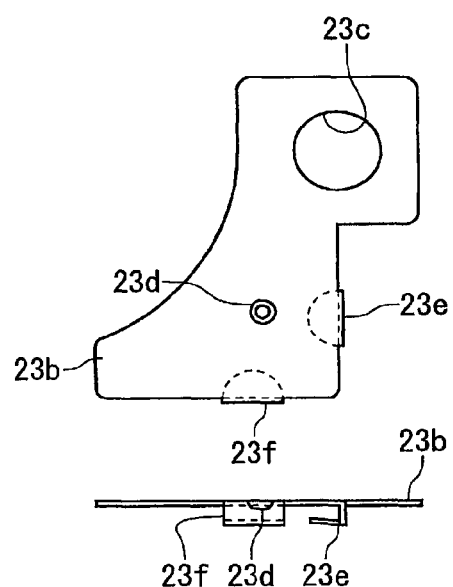
FIG. 10B is a front view of the connection members 23a and 23b.

As shown in FIG. 10, the connection members 23a and 23b have the same structure, include the screw hole 23c, the convex portion 23d, and the locking claws 23e and 23f, and are formed by performing a pressing process on a thin plate member (for example, a metal plate such as a stainless steel plate, a phosphor-bronze plate, a copper plate, and a brass plate and a synthetic resin plate) having high elasticity.

The screw hole 23c is formed to penetrate the connection members 23a and 23b, the convex portions 23d having a substantially conical shape and protruding from the rear sides of the connection members 23a and 23b are formed therein, and the locking claws 23e and 23f protruding to the rear side from the end faces of the connection members 23a and 23b and being bent to be parallel to the rear surface are formed therein.

Method of Assembling Light-emitting Module 20

A method of assembling the light-emitting module 20 will be described with reference to FIGS. 7A and 7B to FIG. 10.

First, the LED lamp 21 is placed on the surface of the chassis 14 so that the light-emitting section 21b faces the upside, and the LED lamp 21 is mounted on and fixed to the chassis 14 by inserting the male screw 15 into the screw hole 21h of the LED lamp 21 and screwing the male screw 15 to the female screw hole (not shown) of the chassis 14.

Then, the flexible boards 22a and 22d placed on the LED lamp 21 so that the electrode portions 22c and 22d face the downside, the electrode portion 22d of the flexible board 22a is brought into contact with the external electrode 21f of the LED lamp 21, and the electrode portion 22d of the flexible board 22b is brought into contact with the external electrode 21g of the LED lamp 21, whereby they are electrically connected.

Subsequently, the connection members 23a and 23b are inserted from the horizontal direction of the LED lamp 21, the locking claws 23e and 23f of the connection member 23a is fitted into the mounting concave portions 21i and 21j of the insulating substrate 21a of the LED lamp 21, respectively, the locking claws 23e and 23f of the connection member 23b are fitted into the mounting concave portions 23k and 23l of the LED lamp 21, respectively, and the screw holes 23c of the connection members 23a and 23b are matched with the notched portions 21d and 21e of the LED lamp 21.

The male screws 15 are inserted into the screw holes 23c of the connection members 23a and 23b and the notched portions 21d and 21e of the LED lamp 21, and the male screws 15 are screwed into the female screw holes (not shown) of the chassis 14.

As a result, the LED lamp 21 and the flexible boards 22a and 22b are sandwiched and fixed between the chassis 14 and the connection members 23a and 23b.

Then, since the convex portions 23d protruding downward from the connection members 23a and 23b press the flexible film members located on the rear side of the electrode portions 22d of the flexible boards 22a and 22b and the electrode portions 22d of the flexible boards 22a and 22b are urged to the external electrodes 21f and 21g of the LED lamp 21, the electrode portions 22d and the external electrodes 21f and 21g come in close contact with each other, thereby reducing contact resistance.

At this time, since the connection members 23a and 23b are slightly elastically deformed and a stress due to the elastic deformation is added to the pressing force of the convex portions 23d, the electrical connection between the electrode portions 22d and the external electrodes 21f and 21g can be achieved more satisfactorily.

Since the locking claws 23e and 23f of the connection members 23a and 23b are fitted into the mounting concave portions 21i and 21j of the insulating substrate 21a of the LED lamp 21, it is possible to prevent positional misalignment of the connection members 23a and 23b with the LED lamp 21 and to satisfactorily fix and maintain them.

Since the locking claws 23e and 23f of the connection members 23a and 23b are fitted into the mounting concave portions 22f and 22g of the flexible boards 22a and 22b, it is possible to prevent positional misalignment of the flexible boards 22a and 22b with the LED lamp 21 and to satisfactorily fix and maintain them.

When the light-emitting module 20 assembled in this way is used, a power supply cable of a DC power source is connected to the electrode portions 22c of the flexible boards 22a and 22b to apply a DC voltage to the external electrodes 21f and 21g of the LED lamp 21 via the wiring patterns 22e and the electrode portions 22d from the electrode portions 22c, whereby DC power is supplied to the LED chips 11e to turn on the LED chips.

Operations and Advantages of Second Embodiment

The following operations and advantages can be obtained from the light-emitting module 20 according to the second embodiment.

(12) The LED lamp 21 and the flexible boards 22a and 22b are sandwiched and fixed between the chassis 14 and the connection members 23a and 23b.

The electrode portions 22d of the flexible boards 22a and 22b are pressed against the external electrodes 21f and 21g of the LED lamp 21 by the connection members 23a and 23b attached to the flexible boards 22a and 22b, and the external electrodes 21f and 21g and the electrode portions 22d come in direct contact with each other and are electrically connected to each other.

Therefore, the light-emitting module 20 can solve the problems with the conductive member of US 2009/0206718 A1.

Figure 7A:
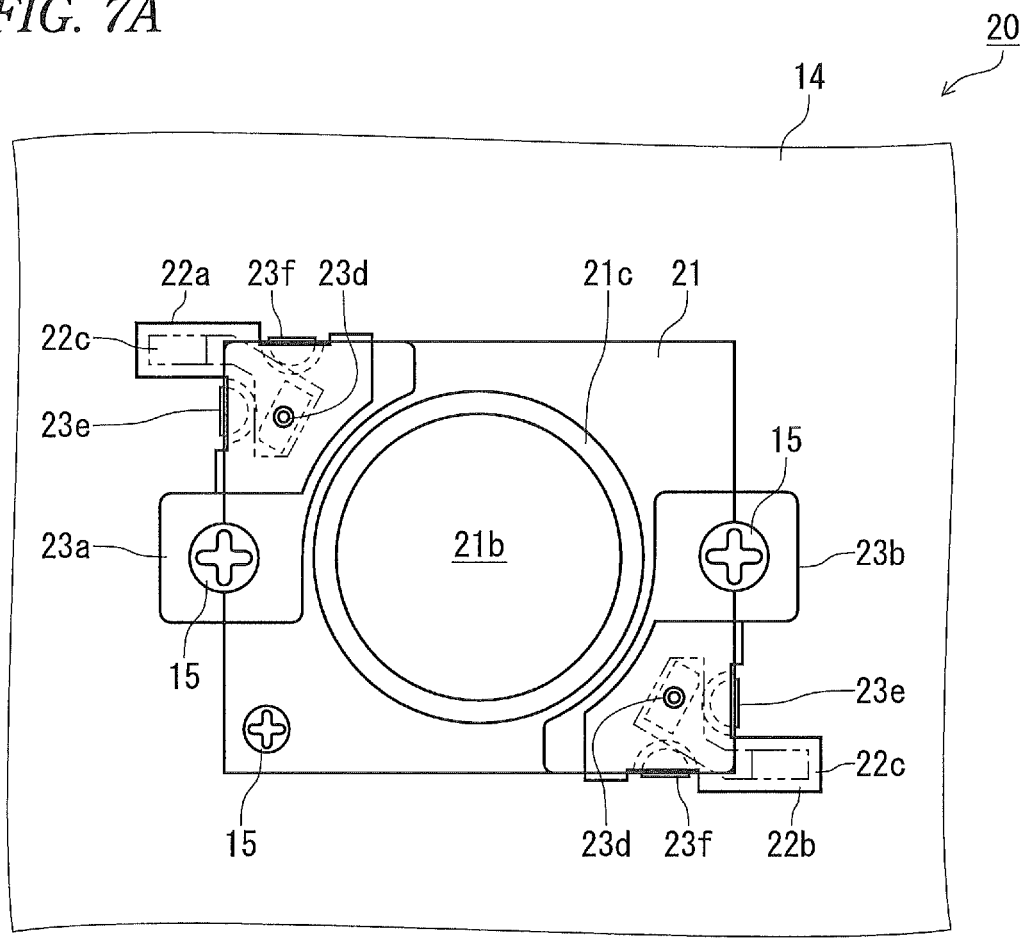
FIG. 7A is a partially-transparent top view of a light-emitting module 20 according to a second embodiment of the invention.
Figure 7B:
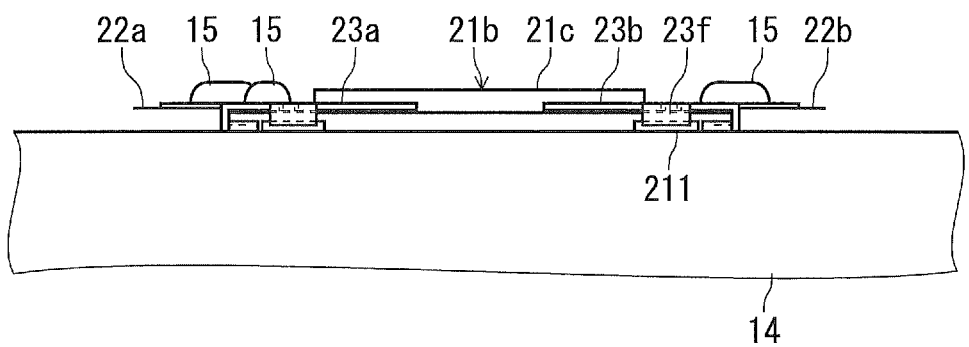
FIG. 7B is a front view of the light-emitting module 20.

(13) As shown in FIG. 7B, the connection members 23a and 23b are lower than the sealing frame 21c of the LED lamp 21 in the height direction of the light-emitting module 20.

That is, the highest portion of the connection members 23a and 23b from the surface (the insulating substrate 21a of the LED lamp 21) of the chassis 14 is lower than the highest portion of the sealing frame 21c from the surface of the chassis 14.

Accordingly, since the emitted light of the LED lamp 21 (the LED chips 11e) is not blocked by the connection members 23a and 23b, it is possible to efficiently emit light from the LED lamp 21 and to prevent a shadow of the connection members 23a and 23b from being formed on an irradiated surface irradiated with the emitted light of the LED lamp 21.

(14) The connection members 23a and 23b press the flexible film member located on the rear side of the electrode portions 22d of the flexible boards 22a and 22b by the use of the elastic force of the connection members 23a and 23b, and the electrode portions 22d are urged to the external electrodes 21f and 21g of the LED lamp 21 by the use of the pressing force. Accordingly, the electrode portions 22d come in close contact with the external electrodes 21f and 21g to reduce the contact resistance therebetween, thereby satisfactorily achieving the electrical connection therebetween.

(15) The convex portions 23d having a substantially conical shape and protruding downward are formed in the connection members 23a and 23b, and the tips of the convex portions 23d press the flexible film member located on the rear side of the electrode portions 22d of the flexible boards 22a and 22b. Accordingly, since the pressing force is concentrated on the tips of the convex portions 23d, it is possible to further enhance the operation and advantage of (14).

The height of the convex portions 23d can be set by experimentally acquiring the optimal height depending on the thickness of the flexible boards 22a and 22b.

(16) The sealing frame 21c of the LED lamp 21 is formed on the insulating substrate 21a to surround plural LED chips 11e. The sealing body 11d is filled in the sealing frame 21c to seal the LED chips 11e.

Accordingly, by adjusting the height position of the sealing frame 21c from the insulating substrate 21a, it is possible to control the emission direction of light from the LED chips 11e.

(17) Outside of the sealing frame 21c of the LED lamp 21, the end faces of the flexible boards 22a and 22b are located inside the end faces of the connection members 23a and 23b, and the flexible boards 22a and 22b do not protrude from the end faces of the connection members 23a and 23b.

Accordingly, since the emitted light of the LED lamp 21 is not blocked by the flexible boards 22a and 22b, it is possible to efficiently emit light from the LED lamp 21 and to prevent shadows of the flexible boards 22a and 22b from being formed on an irradiated surface irradiated with the emitted light of the LED lamp 21.

Outside the sealing frame 21c the LED lamp 21, even when the end faces of the flexible boards 22a and 22b are flush with the end faces of the connection members 23a and 23b, the same advantage can be obtained.

(18) When the connection members 23a and 23b are formed of a material (such as a metal thin plate member) having high thermal conductivity, it is possible to dissipate heat generated from the LED chips 11e by transmitting the generated heat from the external electrodes 21f and 21g of the insulating substrate 21a to the chassis 14 via the connection members 23a and 23b and thus to prevent the overheating of the LED chips 11e, thereby preventing disorder and enhancing emission quality.

(19) The top surface of the chassis 14 comes in surface contact with the rear surface (the opposite surface to the surface on which the LED chips 11e are mounted) of the insulating substrate 21a of the LED lamp 21.

Accordingly, since heat generated from the LED chips 11e can be dissipated by transmitting the heat from the rear surface of the insulating substrate 21a to the chassis 14, it is possible to further enhance heat dissipation performance.

(20) When the connection members 23a and 23b are formed of a material having high light reflectivity or are subjected to a process (such as a plating process) for enhancing the light reflectivity to enhance the light reflectivity of the surface of the connection members 23a and 23b, a part of the emitted light of the LED lamp 21 is reflected by the connection members 23a and 23b and it is thus possible to enhance the emission efficiency of the light-emitting module 20.

(21) By means of (12) to (20) described above, it is possible to provide a low-cost light-emitting module 20 which can satisfactorily and simply achieve electrical connection between the flexible boards 22a and 22b and the LED lamp 21, which does not block light emitted from the LED chips 11e of the LED lamp 21, and which can prevent degradation in emission quality.

Third Embodiment

As shown in FIGS. 11A, 11B, and 11C to FIGS. 16A and 16B, a light-emitting module 30 according to a third embodiment of the invention includes an LED lamp 11 (an insulating substrate 11a, a light-emitting section 11b, a sealing frame 11c, a sealing body 11d, LED chips 11e, and external electrodes 11f and 11g), a flexible board 31 (electrode portions 31a to 31d, wiring patterns 31e to 31j, a mounting hole 31k, bending portions 31l to 31o, and a top portion 31p), a connection member 32 (a mounting hole 32a, screw holes 32b and 32c, convex portions 32d, locking claws 32e, a housing section 32f, and mounting portions 32g and 32h), and a heat dissipater 33 (notched portions 33a), and is mounted on and fixed to a chassis 14 using male screws 15.

As shown in FIGS. 12A and 12B and FIGS. 13A, 13B, and 13C, the flexible substrate 31 includes the electrode portions (connection portions) 31a to 31d, the wiring patterns 31e to 31j, the mounting hole 31k, the bending portions 31l to 31o, and the top portion 31p.

The top portion 31p having a substantially square shape is formed on the flexible board 31 having a sheet shape.

The mounting hole 32k is formed to penetrate the top portion 31p, the electrode portions 31c and 31d are disposed outside the sides of the mounting hole 32k having a substantially square shape, and the bending portions 31l to 31i o having a substantially rectangular shape are connected to the sides of the top portion 31p.

Similarly to the flexible board 12, the flexible board 31 has a structure in which a metal foil having high conductivity is interposed between flexible film members formed of a synthetic resin having an insulating property.

The electrode portions 31a to 31d are formed of portions formed by removing the flexible film member on the rear side of the flexible board 31 to expose the metal foil.

That is, the surface of the flexible board 31 shown in FIG. 12A is covered with the flexible film member and the electrode portions 31a to 31d are formed on the rear side of the flexible board 31 shown in FIG. 12B.

The wiring patterns 31e to 31j are formed of a metal foil, and the wiring pattern 31e connecting the electrode portion 31a and the electrode portion 31c and the wiring pattern 31f connecting the electrode portion 31b and the electrode portion 31d are formed in parallel in the bending portion 31l.

The electrode portions 31a and 31b are formed at an end of the bending portion 31l, the wiring pattern 31g connecting two electrode portions 31c is formed in the bending portion 31m, the wiring patterns 31i and 31j connected to the electrode portions 31c and 31d, respectively, are formed in the bending portion 31n, and the wiring pattern 31h connecting two electrode portions 31d are formed in the bending portion 31o.

In order to prevent an increase in contact resistance due to corrosion of the exposed metal foil in the electrode portions 31a to 31d, the surface of the metal foil may be plated with various metals.

In the example shown in FIGS. 12A and 12B, since the transparent flexible film member is used, the electrode portions 31a to 31d and the wiring patterns 31e to 31j are seen through the flexible film member.

Figure 14A:
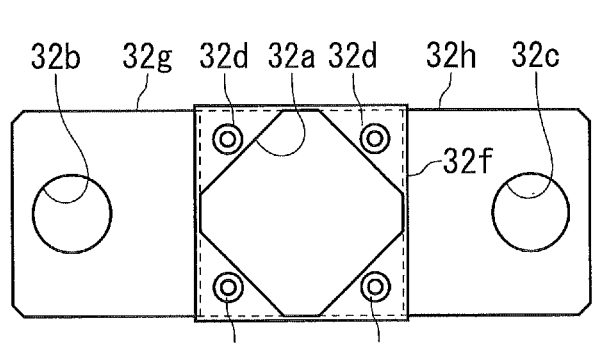
FIG. 14A is a top view of a connection member 32 of the light-emitting module 30.
Figure 14B:
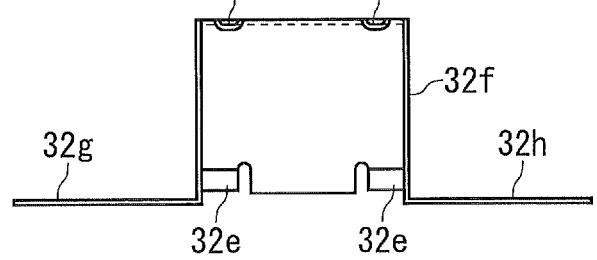
FIG. 14B is a front view of the connection member 32.
Figure 14C:
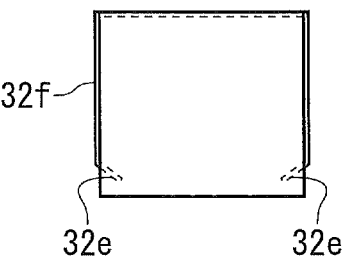
FIG. 14C is a right side view of the connection member 32.

As shown in FIGS. 14A, 14B, and 14C, the connection member 32 includes the mounting hole 32a, the screw holes 32b and 32c, the convex portions 32d, the locking claws 32e, the housing section 32f, and the mounting portions 32g and 32h, and is formed by performing a bending process on a thin plate member (for example, a metal plate such as a stainless steel plate, a phosphor-bronze plate, a copper plate, and a brass plate and a synthetic resin plate) having high elasticity.

The mounting hole 32a is formed on the top surface of the housing section 32f having a rectangular parallelepiped shape of which the bottom surface is opened by penetration, the screw holes 32b and 32c are formed in the rectangular mounting portions 32g and 32h connected to the bottom portion of the opposing sidewall portions of the housing section 32f by penetration, four convex portions 32d having a substantially conical shape and protruding to the rear surface of the connection member 32 are formed in the vicinities of the sides of the substantially-square mounting hole 32a, and the locking claws 32e bent to the inside of the housing section 32f are formed on both sides of the bottom portion of the sidewall portions not connected to the mounting portions 32g and 32h out of the sidewall portions of the housing section 32f.

The sidewall portions of the housing section 32f are simply bent, but are not connected and fixed to each other.

Figure 15A:
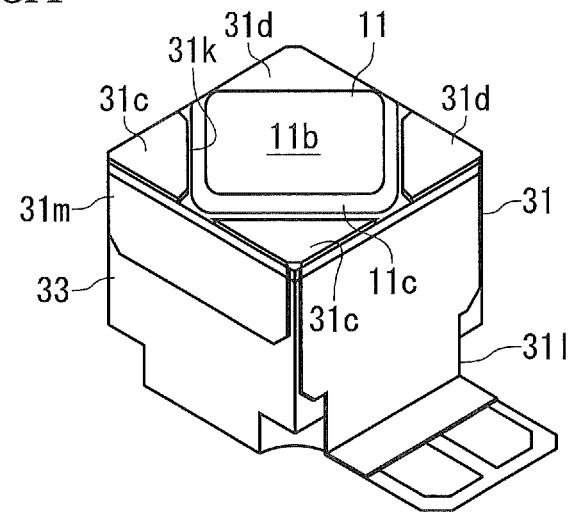
FIG. 15A is a perspective view illustrating a state where the LED lamp 11 and the flexible board 31 are placed on a heat dissipater 33 of the light-emitting module 30 and the flexible board 31 is bent.
Figure 15B:
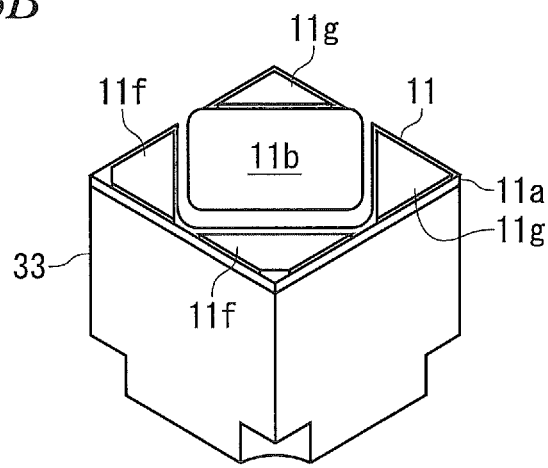
FIG. 15B is a perspective view illustrating a state where the LED lamp 11 is placed on the heat dissipater 33.
Figure 15C:
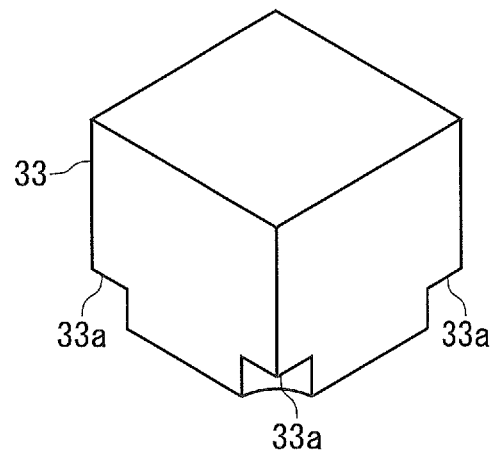
FIG. 15C is a perspective view of the heat dissipater 33.

As shown in FIG. 15C, the heat dissipater (heat-dissipating block) 33 having a substantially rectangular parallelepiped shape is formed of a material (for example, a metal material such as copper, aluminum, and alloys thereof and a synthetic resin) having high heat dissipation performance, and the notched portions 33a cut out in a substantially fan-like pillar shape are formed at four corners of the bottom portion of the heat dissipater 33.

Method of Assembling Light-emitting Module 30

A method of assembling the light-emitting module 30 will be described below with reference to FIGS. 11A, 11B, and 11C to FIGS. 16A and 16B.

First, as shown in FIG. 15B, the LED lamp 11 is placed on the top surface of the heat dissipater 33 so that the light-emitting section 11b faces the upside.

Since the size and shape of the top surface of the heat dissipater 33 are substantially the same as the size and shape of the rear surface of the insulating substrate 11a of the LED lamp 11, the entire rear surface of the insulating substrate 11a comes in contact with the entire top surface of the heat dissipater 33.

Accordingly, when a mirror-like finishing process is performed on the top surface of the heat dissipater 33 to smooth the top surface, the bottom surface of the insulating substrate 11a of the LED lamp 11 closely adheres to the top surface of the heat dissipater 33 and comes in surface contact therewith, and it is thus possible to efficiently transmit heat generated from the LED lamp 11 to the heat dissipater 33 and to dissipate the heat.

When heat-dissipating grease (not shown) is applied to the top surface of the heat dissipater 33 and the LED lamp 11 is placed on the heat-dissipating grease, the LED lamp 11 can be temporarily fixed to the heat dissipater 33 and the top surface of the heat dissipater 33 comes in surface contact with the rear surface of the insulating substrate 11a with the heat-dissipating grease interposed therebetween, thereby enhancing the heat dissipation performance.

As shown in FIG. 15A, the flexible board 31 is placed on the LED lamp 11 so that the sealing frame 11c of the LED lamp 11 is fitted into the mounting hole 31k of the flexible board 31 and the electrode portions 31a to 31d face the upside.

Then, two electrode portions 31c of the flexible board 31 come in contact with two external electrodes 11f of the LED lamp 11 and two electrode portions 31d of the flexible board 31 come in contact with two external electrodes 11g of the LED lamp 11, whereby they are electrically connected to each other.

The bending portions 31l to 31o of the flexible board 31 are bent to bring the rear surfaces of the bending portions 31l to 31o into contact with the sidewall portions of the heat dissipater 33.

Since bending marks are formed in the joints between the top surface 31p of the flexible board 31 and the bending portions 31l to 31o, the bending portions 31l to 31o can be easily bent to the rear surface of the flexible board 31.

Since the size and shape of the electrode portions 12c and 12d of the flexible board 31 are substantially the same as the size and shape of the external electrodes 11f and 11g of the LED lamp 11, the entire surfaces of the electrode portions 12c and 12d come in contact with the entire surfaces of the external electrodes 11f and 11g, thereby reducing the contact resistance therebetween.

When the mounting hole 31k of the flexible board 31 is formed to be slightly larger than the sealing frame 11c of the LED lamp 11, the sealing frame 11c is fitted into the mounting hole 31k substantially without any gap and thus the electrode portions 31c and 31d can be prevented from causing positional misalignment with the external electrodes 11f and 11g, thereby satisfactorily bringing them in contact with each other.

Figure 16A:
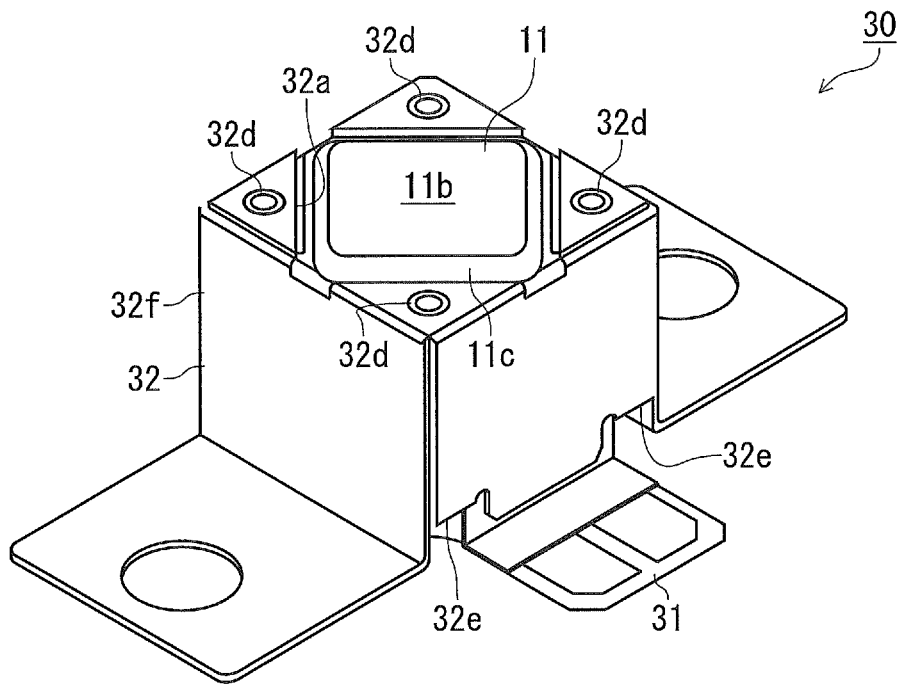
FIG. 16A is a perspective view of the light-emitting module 30 when seen from the upper side.
Figure 16B:
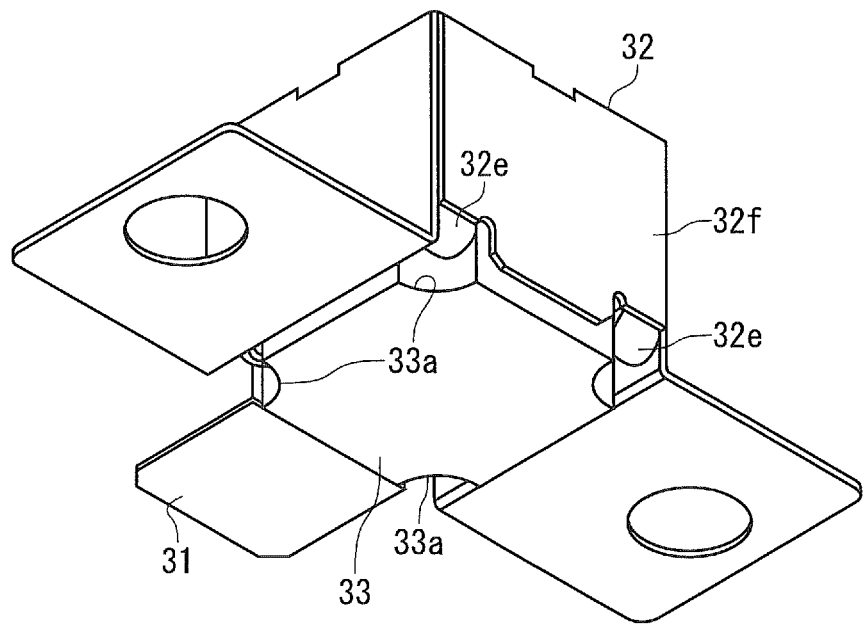
FIG. 16B is a perspective view of the light-emitting module 30 when seen from the downside.

Subsequently, as shown in FIGS. 16A and 16B, the housing section 32f of the connection member 32 is fitted to the heat dissipater 33 on which the flexible board 31 and the LED lamp 11 are placed so that the sealing frame 11c of the LED lamp 11 is fitted into the mounting hole 32a of the connection member 32, whereby the flexible board 31, the LED lamp 11, and the heat dissipater 33 are housed in the housing section 32f.

Then, the bending portions 31l to 31o of the flexible board 31 are sandwiched and fixed between the sidewall portions of the connection member 32 and the sidewall portions of the heat dissipater 33.

By curving the sidewall portions not connected to the mounting portions 32g and 32h out of the sidewall portions of the connection member 32, four locking claws 32e of the connection member 32 are fitted into four notched portions 33a of the heat dissipater 33, respectively.

As a result, the flexible board 31, the LED lamp 11, and the heat dissipater 33 are held and fixed by the connection member 32 to unify the flexible board 31, the LED lamp 11, the heat dissipater 33, and the connection member 32.

Then, since four convex portions 32d protruding downward from the top surface of the connection member 32 press the flexible film member located on the rear side of the electrode portions 31c and 31d of the flexible board 31 and the electrode portions 31c and 31d are urged to the external electrodes 11f and 11g of the LED lamp 11 due to the pressing force thereof, the electrode portions 31c and 31d and the external electrodes 11f and 11g come in close contact with each other, thereby reducing the contact resistance therebetween.

At this time, since the top surface of the connection member 32 is slightly elastically deformed and a stress due to the elastic deformation is applied as a pressing force of the convex portions 32d, the electrode portions 31c and 31d and the external electrodes 11f and 11g can be electrically connected to each other more satisfactorily.

When the mounting hole 32a of the connection member 32 is formed to be slightly larger than the sealing frame 11c of the LED lamp 11, the sealing frame 11c is fitted into the mounting hole 32a substantially without any gap therebetween and it is thus possible to further satisfactorily prevent the connection member 32 from causing positional misalignment with the LED lamp 11, thereby holding and fixing them.

When the housing section 32f of the connection member 32 is formed to be slightly larger than the unified body of the LED lamp 11, the flexible board 31, and the heat dissipater 33, the unified body is fitted into the housing section 32f substantially without any gap therebetween, thereby further preventing the connection member 32 from causing positional misalignment with the LED lamp 11.

Figure 11A:
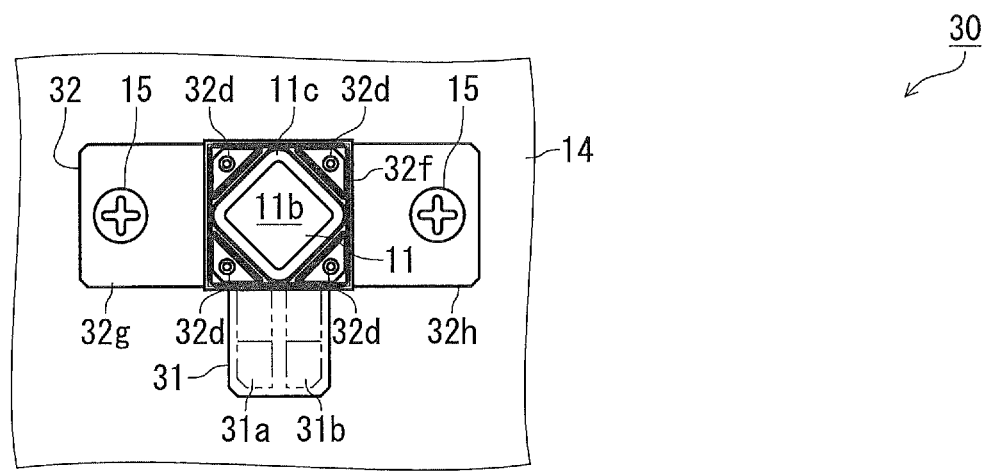
FIG. 11A is a partially-transparent top view of a light-emitting module 30 according to a third embodiment of the invention.
Figure 11B:
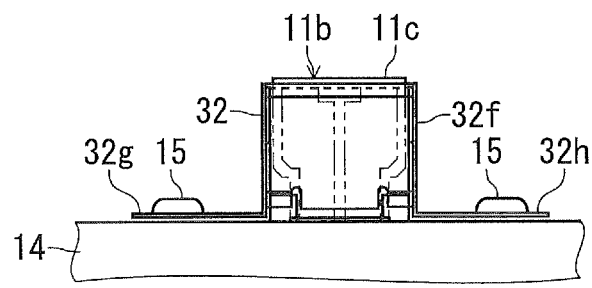
FIG. 11B is a partially-transparent front view of the light-emitting module 30.
Figure 11C:
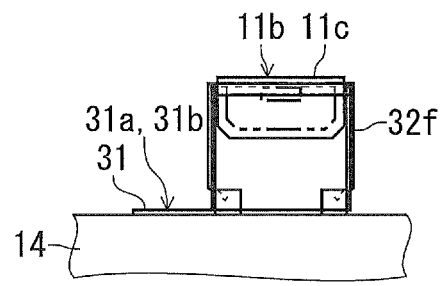
FIG. 11C is a partially-transparent right side view of the light-emitting module 30.
Figure 13A:
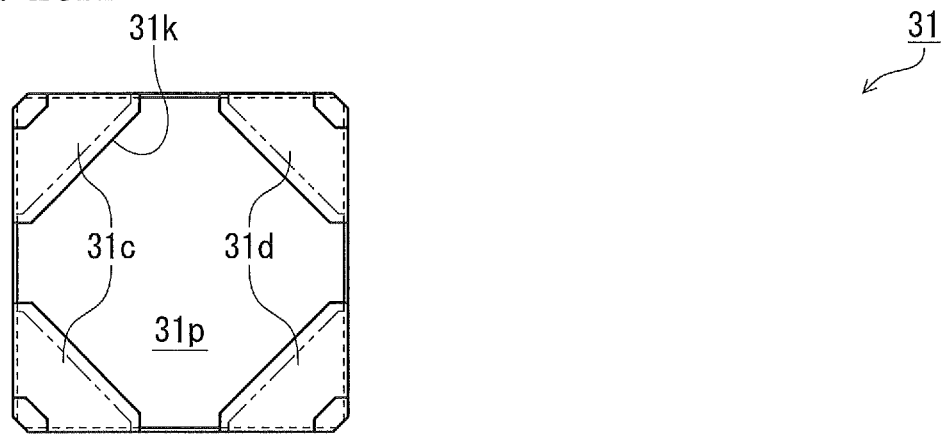
FIG. 13A is a top view illustrating a state where the flexible board 31 is bent.
Figure 13B:
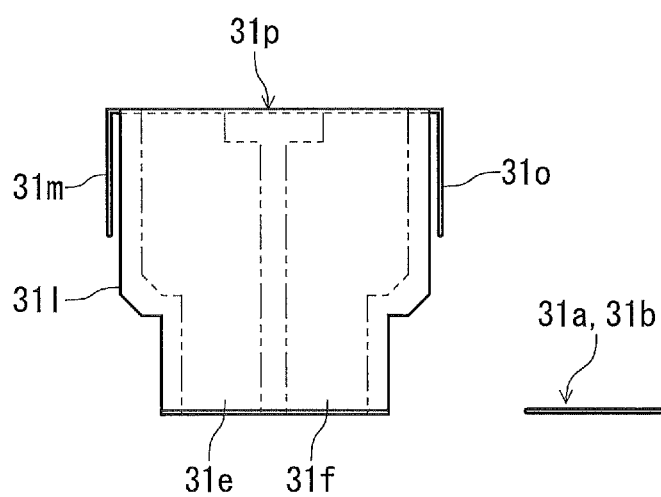
FIG. 13B is a front view illustrating a state where the flexible board 31 is bent.
Figure 13C:
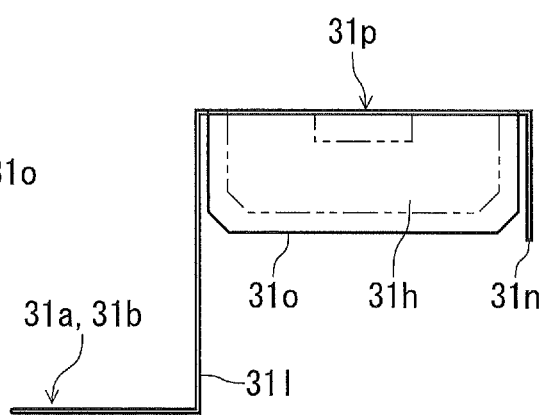
FIG. 13C is a right side view illustrating a state where the flexible board 31 is bent.

Thereafter, as shown in FIGS. 11A, 11B, and 11C, the connection member 32 having the flexible board 31, the LED lamp 11, and the heat dissipater 33 held and fixed thereto are placed on the surface of the chassis 14 so that the light-emitting section 11b of the LED lamp 11 faces the upside, the male screws 15 are inserted into the screw holes 32b and 32c of the connection member 32, and the male screws 15 are screwed into the female screw holes (not shown) of the chassis 14, whereby the connection member 32 is mounted on and fixed to the chassis 14.

As shown in FIG. 16B, since the bottom surface of the heat dissipater 33 is exposed from the opened bottom of the connection member 32, the bottom surface of the heat dissipater 33 comes in surface contact with the surface of the chassis 14.

Accordingly, when a mirror-like finishing process is performed on the surface of the chassis 14 to smooth the surface, the bottom surface of the heat dissipater 33 closely adheres to the surface of the chassis 14 and comes in surface contact therewith and it is thus possible to efficiently transmit heat generated from the LED lamp 11 to the chassis 14 and to dissipate the heat.

When a heat-dissipating grease (not shown) is applied to the surface of the chassis 14 and the heat dissipater 33 is placed on the heat-dissipating grease, it is possible to temporarily fix the light-emitting module 30 to the chassis 14 and to enhance the heat dissipation performance because the surface of the chassis 14 and the bottom surface of the heat dissipater 33 come in surface contact with each other with the heat-dissipating grease interposed therebetween.

When using the light-emitting module 30 assembled in this way, a power supply cable of a DC power source is connected to the electrode portions 31a and 31b the flexible board 31 protruding from the connection member 32 and a DC voltage is applied to the external electrodes 11f and 11g of the LED lamp 11 via the wiring patterns 31e and 31f and the electrode portions 31c and 31d from the electrode portions 31a and 31b, whereby DC power is supplied to the LED chips 11e to turn on the LED chips.

Operations and Advantages of Third Embodiment

In the light-emitting module 30 according to the third embodiment, the following operations and advantages can be obtained in addition to the operations and advantages of (5) in the first embodiment.

(22) The LED lamp 11 and the flexible board 31 are sandwiched and fixed to the connection member 32.

The electrode portions 31c and 31d of the flexible board 31 are pressed against the external electrodes 11f and 11g of the LED lamp 11 by the connection member 32 attached to the flexible board 31, and the external electrodes 11f and 11g and the electrode portions 31c and 31d come in direct contact with each other and are electrically connected to each other.

Therefore, the light-emitting module 30 can solve the problems with the conductive member of US 2009/0206718 A1.

(23) As shown in FIG. 11B, the connection member 32 is lower than the sealing frame 11c of the LED lamp 11 in the height direction of the light-emitting module 30.

That is, the highest portion of the connection member 32 from the surface (the insulating substrate 11a of the LED lamp 11) of the chassis 14 is lower than the highest portion of the sealing frame 11c from the surface of the chassis 14.

Accordingly, since the emitted light of the LED lamp 11 (the LED chips 11e) is not blocked by the connection member 32, it is possible to efficiently emit light from the LED lamp 11 and to prevent a shadow of the connection member 32 from being formed on an irradiated surface irradiated with the emitted light of the LED lamp 11.

(24) The connection member 32 presses the flexible film member located on the rear side of the electrode portions 31c and 31d of the flexible board 31 by the use of the elastic force of the connection member 32 and the electrode portions 31c and 31d are urged to the external electrodes 11f and 11g of the LED lamp 11 by the use of the pressing force. Accordingly, the electrode portions 31c and 31d come in close contact with the external electrodes 11f and 11g to reduce the contact resistance therebetween, thereby satisfactorily achieving the electrical connection therebetween.

(25) Four convex portions 32d having a substantially conical shape and protruding downward are formed in the connection member 32 and the tips of the convex portions 32d press the flexible film member located on the rear side of the electrode portions 31c and 31d of the flexible board 31. Accordingly, since the pressing force is concentrated on the tips of the convex portions 32d, it is possible to further enhance the operation and advantage of (24).

The height of the convex portions 32d can be set by experimentally acquiring the optimal height depending on the thickness of the flexible board 31.

(26) The end face of the mounting hole 31k of the flexible board 31 is flush with the end face of the mounting hole 32a of the connection member 32, or the end face of the mounting hole 31k is located inside the end face of the mounting hole 32a, and the flexible board 31 does not protrude from the mounting hole 32a of the connection member 32.

Accordingly, since the emitted light of the LED lamp 11 is not blocked by the flexible board 31, it is possible to efficiently emit light from the LED lamp 11 and to prevent a shadow of the flexible board 31 from being formed on an irradiated surface irradiated with the emitted light of the LED lamp 11.

(27) When the connection member 32 is formed of a material (such as a metal thin plate member) having high thermal conductivity, it is possible to dissipate heat generated from the LED chips 11e by transmitting the generated heat from the external electrodes 11f and 11g of the insulating substrate 11a to the heat dissipater 33 via the connection member 32 and thus to prevent the overheating of the LED chips 11e, thereby preventing disorder and enhancing emission quality.

(28) The top surface of the heat dissipater 33 (heat-dissipating member) comes in surface contact with the rear surface (the opposite surface to the surface on which the LED chips 11e are mounted) of the insulating substrate 11a of the LED lamp 11.

Accordingly, since heat generated from the LED chips 11e can be dissipated by transmitting the heat from the rear surface of the insulating substrate 11a to the heat dissipater 33, it is possible to further enhance heat dissipation performance.

(29) When the connection member 32 is formed of a material having high light reflectivity or is subjected to a process (such as a plating process) for enhancing the light reflectivity to enhance the light reflectivity of the surface of the connection member 32, a part of the emitted light of the LED lamp 11 is reflected by the connection member 32 and it is thus possible to enhance the emission efficiency of the light-emitting module 30.

(30) When the length of one side of the top portion of the heat dissipater 33 and the top portion 31p of the flexible board 31 is set to about 1.25 times the length of one side of the insulating substrate 11a of the LED lamp 11, the top portion 31p can cover the insulating substrate 11a with a sufficient margin, and it is thus possible to satisfactorily achieve electrical connection between the electrode portions 31c and 31d of the flexible board 31 and the external electrodes 11f and 11g of the LED lamp 11.

(31) A part of the flexible board 31 is bent to cover a part of the LED lamp 11 other than the light-emitting section 11b (the sealing body 11d), whereby the bending portions 31l to 31o are formed.

The bending portions 31l to 31o of the flexible board 31 are bent to come in contact with the sidewall portions of the heat dissipater 33, whereby it is possible to satisfactorily prevent the flexible board 31 from causing positional misalignment with the LED lamp 11 placed on the heat dissipater 33.

(32) The wiring patterns 31e and 31f are formed in the bending portion 31l, the wiring pattern 31g is formed in the bending portion 31m, the wiring patterns 31i and 31j formed in the bending portion 31n, and the wiring pattern 31h is formed in the bending portion 31o.

Accordingly, when the bending portions 31l to 31o of the flexible board 31 come in surface contact with the sidewall portions of the heat dissipater 33, it is possible to transmit heat generated from the LED chips 11e to the heat dissipater 33 from the external electrodes 11f and 11g of the insulating substrate 11a via the wiring patterns 31e to 31j and to dissipate the heat, thereby further enhancing the heat dissipation performance.

When the bending portions 31l to 31o of the flexible board 31 is sandwiched and fixed between the sidewall portions of the connection member 32 and the sidewall portions of the heat dissipater 33 and the bending portions 31l to 31o come in surface contact with the sidewall portions of the connection member 32, it is possible to transmit heat generated from the LED chips 11e to the heat dissipater 33 via the sidewall portions of the connection member 32 from the wiring patterns 31e to 31j and to dissipate the heat, thereby further enhancing the heat dissipation performance.

(33) By means of (5) and (22) to (32) described above, it is possible to provide a low-cost light-emitting module 30 which can satisfactorily and simply achieve electrical connection between the flexible board 31 and the LED lamp 11, which does not block light emitted from the LED chips 11e of the LED lamp 11, and which can prevent degradation in emission quality.

Fourth Embodiment

As shown in FIGS. 17A, 17B, and 17C to FIGS. 22A and 22B, a light-emitting module 40 according to a fourth embodiment of the invention includes an LED lamp 11 (an insulating substrate 11a, a light-emitting section 11b, a sealing frame 11c, a sealing body 11d, LED chips 11e, and external electrodes 11f and 11g), a flexible board 41 (electrode portions 31a to 31d, wiring patterns 31e to 31j, a mounting hole 31k, bending portions 31l and 31n, and a top portion 41p), a connection member 42 (a mounting hole 32a, screw holes 32b and 32c, mounting portions 32g and 32h, convex portions 42e, and a housing section 42f), a heat dissipater 43 (a concave portion 43a), and an O ring 44, and is mounted on and fixed to a chassis 14 using male screws 15.

The light-emitting module 40 according to the fourth embodiment is different from the light-emitting module 30 according to the third embodiment, only in the following points.

(I) As shown in FIGS. 18A and 18B and FIGS. 19A, 19B, and 19C, the flexible substrate 41 includes the electrode portions (connection portions) 31a to 31d, the wiring patterns 31e to 31j, the mounting hole 31k, the bending portions 31l to 31n, and the top portion 41p.

The flexible board 41 according to the fourth embodiment is different from the flexible board 31 according to the third embodiment, in that the bending portions 31m and 31o are not formed, the shapes of the wiring patterns 31e to 31j are different, and the top portion 41p has a substantially circular shape.

The top portion 41p corresponds to the top portion 31p of the flexible board 31.

Figure 20A:
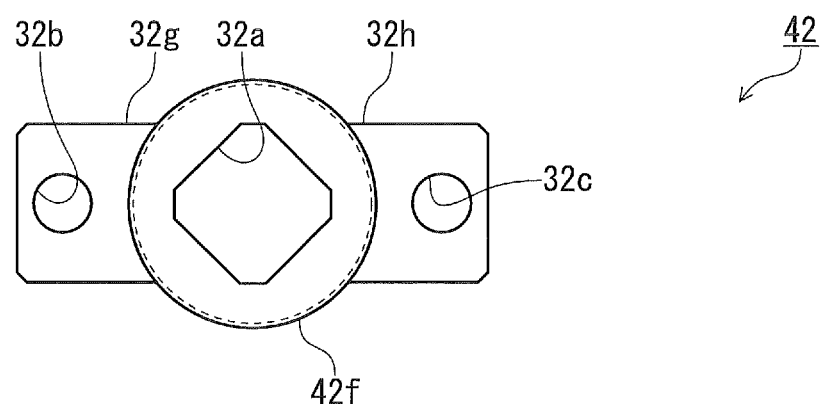
FIG. 20A is a top view of a connection member 42 of the light-emitting module 40.
Figure 20B:
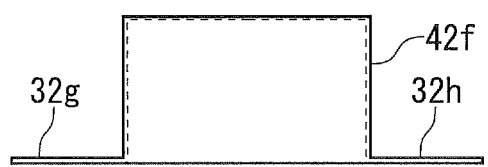
FIG. 20B is a front view of the connection member 42.
Figure 20C:
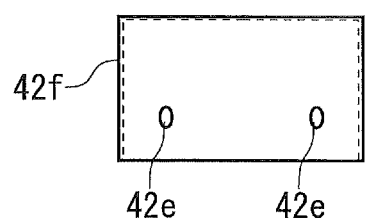
FIG. 20C is a right side view of the connection member 42.

(II) As shown in FIGS. 20A and 20B, the connection member 42 includes the mounting hole 32a, the screw holes 32b and 32c, the mounting portions 32g and 32h, the convex portions 42e, and the housing section 42f, and is formed by performing a pressing process on a thin plate member having high elasticity.

The connection member 42 according to the fourth embodiment is different from the connection member 32 according to the third embodiment, in that the convex portions 32d and the locking claws 32e are not formed, the housing section 42f has a cylindrical shape of which the bottom surface is opened, and four convex portions 42e having a substantially semispherical shape and protruding to the inside of the housing section 42f are formed in the bottom portion of the sidewall portion of the housing section 42f.

The housing section 42f corresponds to the housing section 32f of the connection member 32.

Figure 21A:
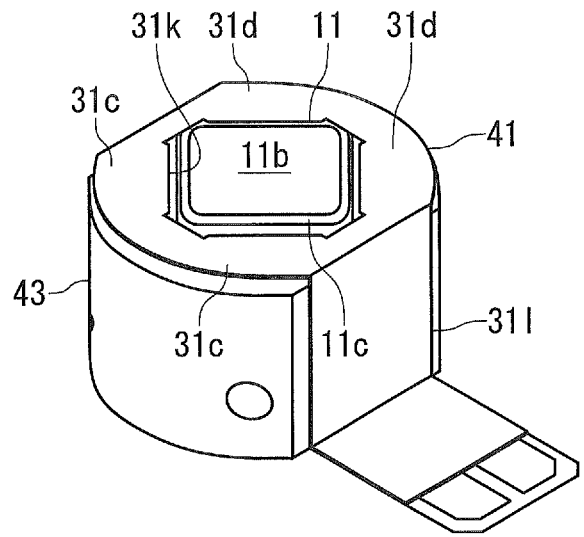
FIG. 21A is a perspective view illustrating a state where the LED lamp 11 and the flexible board 41 are placed on a heat dissipater 43 of the light-emitting module 40 and the flexible board 41 is bent.
Figure 21B:
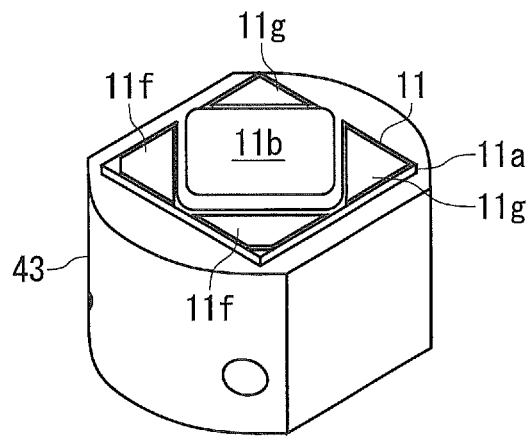
FIG. 21B is a perspective view illustrating a state where the LED lamp 11 is placed on the heat dissipater 43.
Figure 21C:
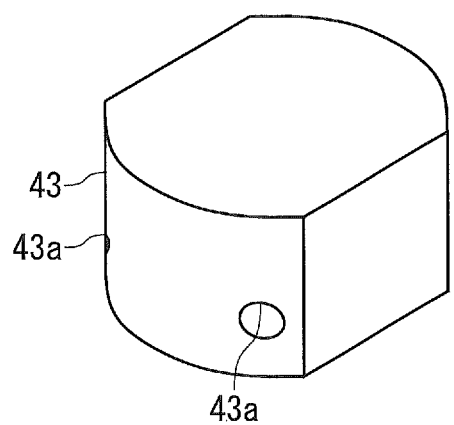
FIG. 21C is a perspective view of the heat dissipater 43.

(III) As shown in FIG. 21C, the heat dissipater (heat-dissipating block) 43 according to the fourth embodiment is different from the heat dissipater 33 according to the third embodiment, in that the notched portions 33a are not formed, the heat dissipater 43 has a substantially cylindrical shape having flat sidewall portions opposed to each other, and four concave portions 43a cut out in a substantially semispherical shape are formed in the bottom portions of the heat dissipater 43.

Method of Assembling Light-emitting Module 40

A method of assembling the light-emitting module 40 will be described below with reference to FIGS. 17A, 17B, and 17C to FIGS. 22A and 22B.

First, as shown in FIG. 21B, the LED lamp 11 is placed on the top surface of the heat dissipater 43 so that the light-emitting section 11b faces the upside.

Since the top surface of the heat dissipater 43 is larger than the rear surface of the insulating substrate 11a of the LED lamp 11, the entire rear surface of the insulating substrate 11a comes in contact with the entire top surface of the heat dissipater 43.

When a mirror-like finishing process is performed on the top surface of the heat dissipater 43 to smooth the top surface or heat-dissipating grease is applied to the top surface of the heat dissipater 43, the same operations and advantages of the heat dissipater 33 according to the third embodiment can be obtained.

As shown in FIG. 21A, the flexible board 41 is placed on the LED lamp 11 so that the sealing frame 11c of the LED lamp 11 is fitted into the mounting hole 31k of the flexible board 41 and the electrode portions 31a to 31d face the upside.

Then, two electrode portions 31c of the flexible board 41 come in contact with two external electrodes 11f of the LED lamp 11 and two electrode portions 31d of the flexible board 41 come in contact with two external electrodes 11g of the LED lamp 11, whereby they are electrically connected to each other.

The bending portions 31l and 31n of the flexible board 41 are bent to bring the rear surfaces of the bending portions 31l and 31n into contact with the flat sidewall portions of the heat dissipater 43.

Since bending marks are formed in the joints between the top surface 41p of the flexible board 41 and the bending portions 31l and 31n, the bending portions 31l and 31n can be easily bent to the rear surface of the flexible board 41.

Figure 22A:
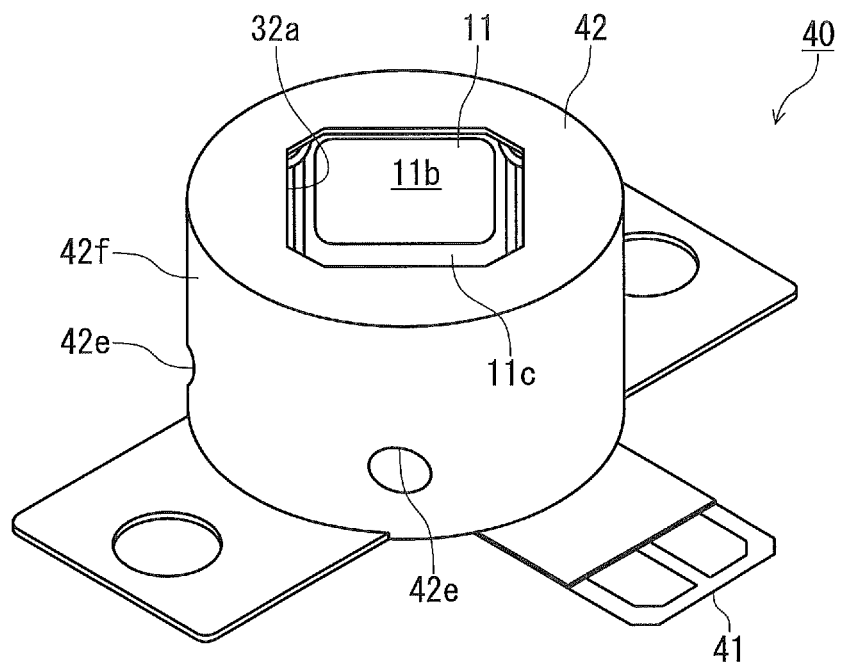
FIG. 22A is a perspective view of the light-emitting module 40.
Figure 22B:
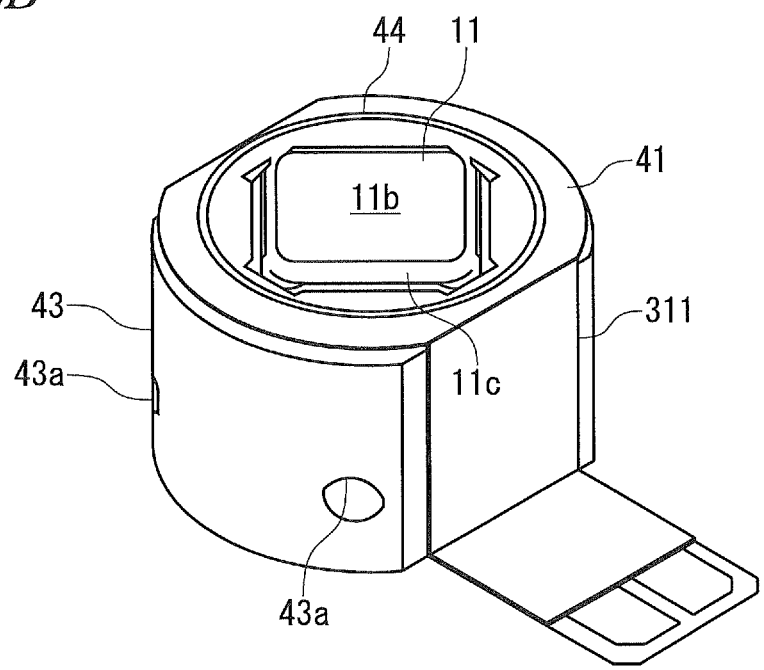
FIG. 22B is a perspective view illustrating a state where an O ring 44 is placed on the flexible board 41.

Subsequently, as shown in FIG. 22B, the circular O ring 44 is placed on the flexible board 41 to surround the sealing frame 11c of the LED lamp 11 exposed from the mounting hole 31k of the flexible board 41.

As shown in FIG. 22A, the housing section 42f of the connection member 42 is fitted to the heat dissipater 43 on which the O ring 44, the flexible board 41, and the LED lamp 11 are placed so that the sealing frame 11c of the LED lamp 11 is fitted into the mounting hole 32a of the connection member 42, whereby the O ring 44, the flexible board 41, the LED lamp 11, and the heat dissipater 43 are housed in the housing section 42f.

Then, four convex portions 42e of the connection member 42 are fitted into four concave portions 43a of the heat dissipater 43, respectively.

As a result, the O ring 44, the flexible board 41, the LED lamp 11, and the heat dissipater 43 are held and fixed by the connection member 42 to unify the O ring 44, the flexible board 41, the LED lamp 11, the heat dissipater 43, and the connection member 42.

Then, since the top surface of the connection member 42 presses the flexible film member located on the rear side of the electrode portions 31c and 31d of the flexible board 41 with the O ring 44 interposed therebetween and the electrode portions 31c and 31d are urged to the external electrodes 11f and 11g of the LED lamp 11 due to the pressing force thereof, the electrode portions 31c and 31d and the external electrodes 11f and 11g come in close contact with each other, thereby reducing the contact resistance therebetween.

At this time, since the top surface of the connection member 42 is slightly elastically deformed and a stress due to the elastic deformation is applied as a pressing force of the O ring 44, the electrode portions 31c and 31d and the external electrodes 11f and 11g can be electrically connected to each other more satisfactorily.

Figure 17A:
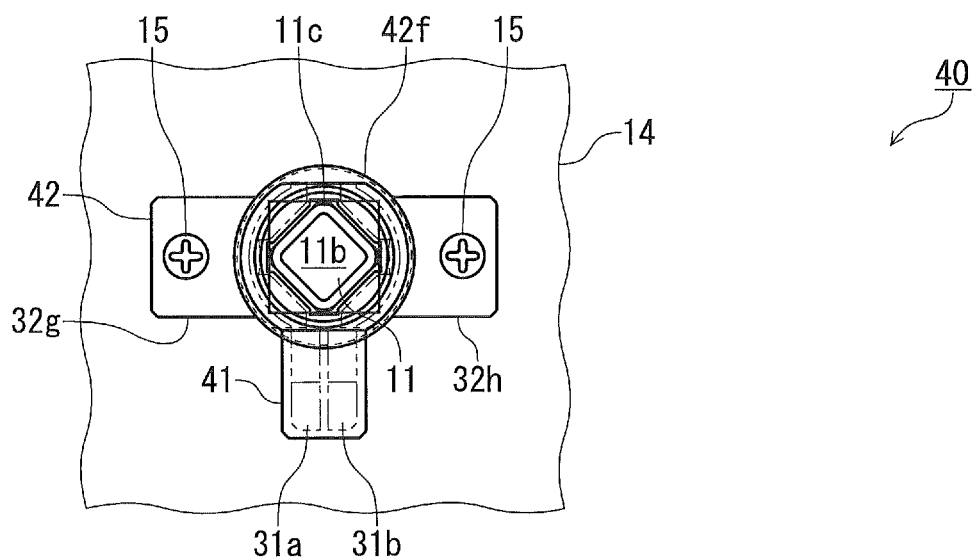
FIG. 17A is a partially-transparent top view of a light-emitting module 40 according to a fourth embodiment of the invention.
Figure 17B:
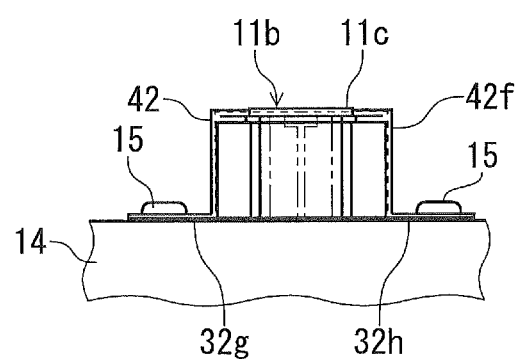
FIG. 17B is a partially-transparent front view of the light-emitting module 40.
Figure 17C:
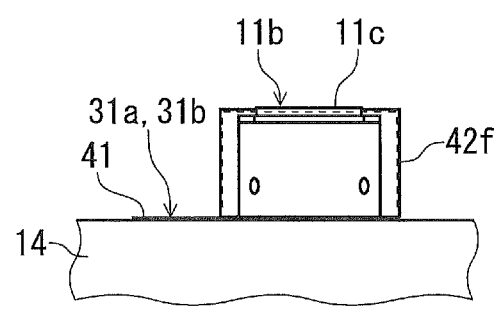
FIG. 17C is a partially-transparent right side view of the light-emitting module 40.
Figure 19A:
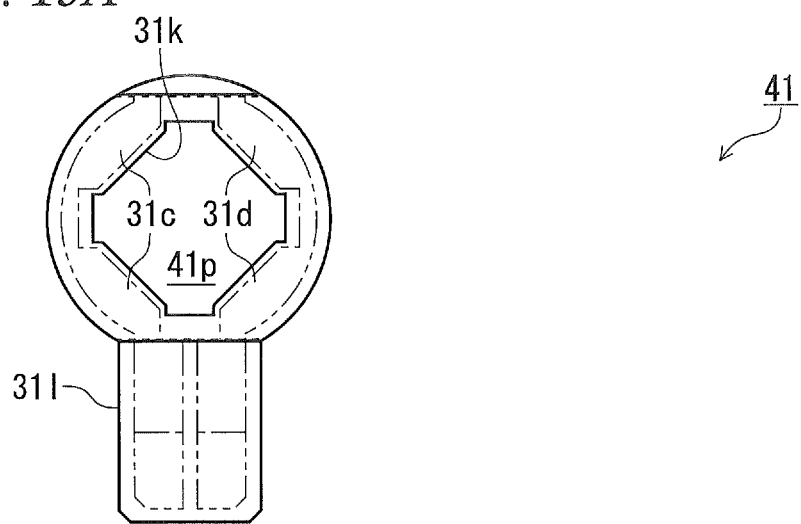
FIG. 19A is a top view illustrating a state where the flexible board 41 is bent.
Figure 19B:
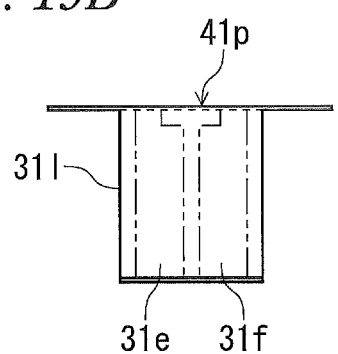
FIG. 19B is a front view illustrating a state where the flexible board 41 is bent.
Figure 19C:
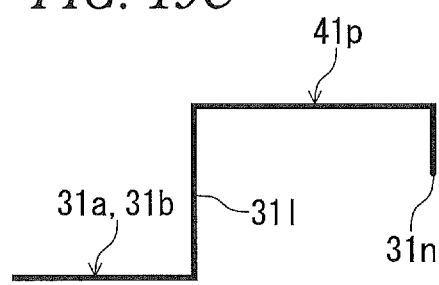
FIG. 19C is a right side view illustrating a state where the flexible board 41 is bent.

Thereafter, as shown in FIGS. 17A, 17B, and 17C, the connection member 42 having the O ring 44, the flexible board 41, the LED lamp 11, and the heat dissipater 43 held and fixed thereto are placed on the surface of the chassis 14 so that the light-emitting section 11b of the LED lamp 11 faces the upside, the male screws 15 are inserted into the screw holes 32b and 32c of the connection member 42, and the male screws 15 are screwed into the female screw holes (not shown) of the chassis 14, whereby the connection member 42 is mounted on and fixed to the chassis 14.

Since the bottom surface of the heat dissipater 43 is exposed from the opened bottom of the connection member 42, the bottom surface of the heat dissipater 43 comes in surface contact with the surface of the chassis 14.

Accordingly, when a mirror-like finishing process is performed on the surface of the chassis 14 to smooth the surface or heat-dissipating grease is applied to the surface of the chassis 14, the same operations and advantages of the chassis 14 according to the third embodiment can be obtained.

Operations and Advantages of Fourth Embodiment

In the light-emitting module 40 according to the fourth embodiment, the following operations and advantages can be obtained in addition to the operations and advantages of (5) in the first embodiment and (22) to (24) and (26) to (29) in the third embodiment.

(34) Since the O ring 44 is interposed between the top surface of the connection member 42 and the flexible board 31 and thus the top surface of the connection member 42 presses the flexible film member located on the rear side of the electrode portions 31c and 31d of the flexible board 41 with the O ring 44 interposed therebetween, the pressing force is concentrated on the O ring 44 and it is thus possible to enhance the operation and advantage of (24).

The diameter of the O ring 44 can be set by experimentally acquiring the optimal height depending on the thickness of the flexible board 41.

(35) When the diameter of the top portion of the heat dissipater 43 and the top portion 41p of the flexible board 41 is set to about 1.25 times the length of one side of the insulating substrate 11a of the LED lamp 11, the top portion 41p can cover the insulating substrate 11a with a sufficient margin, and it is thus possible to satisfactorily achieve electrical connection between the electrode portions 31c and 31d of the flexible board 41 and the external electrodes 11f and 11g of the LED lamp 11.

(36) A part of the flexible board 41 is bent to cover a part of the LED lamp 11 other than the light-emitting section 11b (the sealing body 11d), whereby the bending portions 31l and 31n are formed.

The bending portions 31l and 31n of the flexible board 41 are bent to come in contact with the sidewall portions of the heat dissipater 43, whereby it is possible to satisfactorily prevent the flexible board 41 from causing positional misalignment with the LED lamp 11 placed on the heat dissipater 43.

(37) The wiring patterns 31e and 31f formed in the bending portion 31l and the wiring patterns 31i and 31j are formed in the bending portion 31n.

Accordingly, when the bending portions 31l and 31n the flexible board 41 come in surface contact with the sidewall portions of the heat dissipater 43, it is possible to transmit heat generated from the LED chips 11e to the heat dissipater 43 from the external electrodes 11f and 11g of the insulating substrate 11a via the wiring patterns 31e, 31f, 31i, and 31j and to dissipate the heat, thereby further enhancing the heat dissipation performance.

(38) By means of (5), (22) to (24), (26) to (29), and (34) to (37) described above, it is possible to provide a low-cost light-emitting module 40 which can satisfactorily and simply achieve electrical connection between the flexible board 41 and the LED lamp 11, which does not block light emitted from the LED chips 11e of the LED lamp 11, and which can prevent degradation in emission quality.

Fifth Embodiment

Figure 23A:
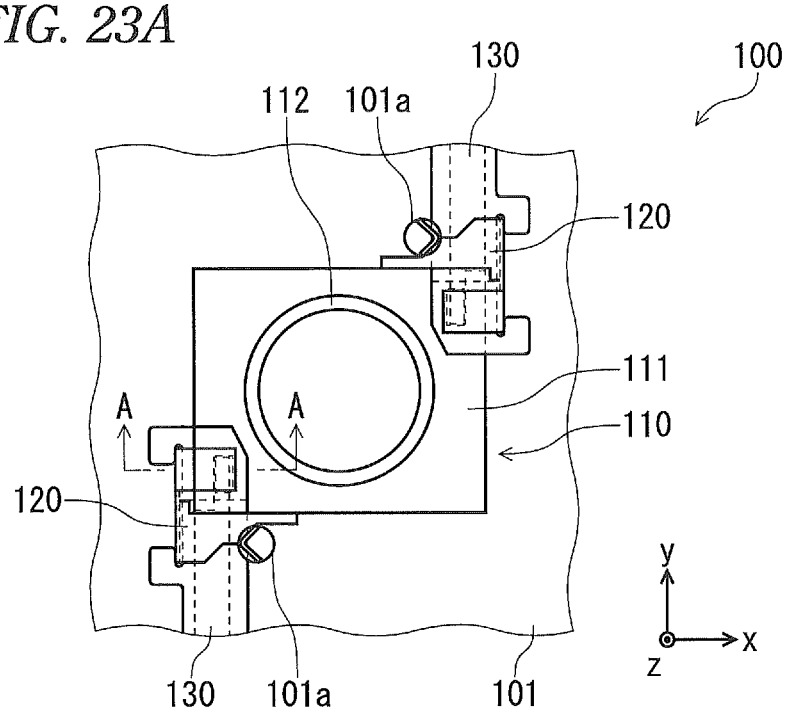
FIGS. 23A and 23B are top views of a light-emitting module according to a fifth embodiment of the invention.
Figure 23B:
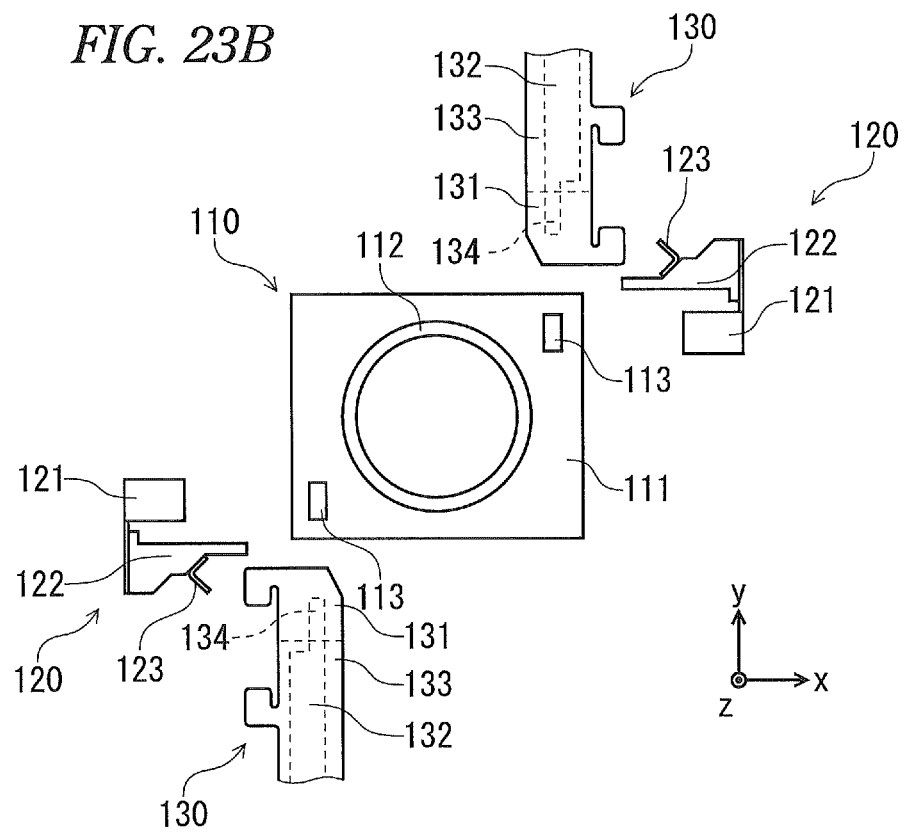

FIGS. 23A and 23B are top views of a light-emitting module 100 according to a fifth embodiment. FIG. 23A is a top view illustrating a state where an LED lamp 110 is fixed to a chassis 101 by a connection member 120 and FIG. 23B is a top view illustrating a state where the LED lamp 110, the connection member 120, and the flexible board 130 are separated.

Figure 24A:
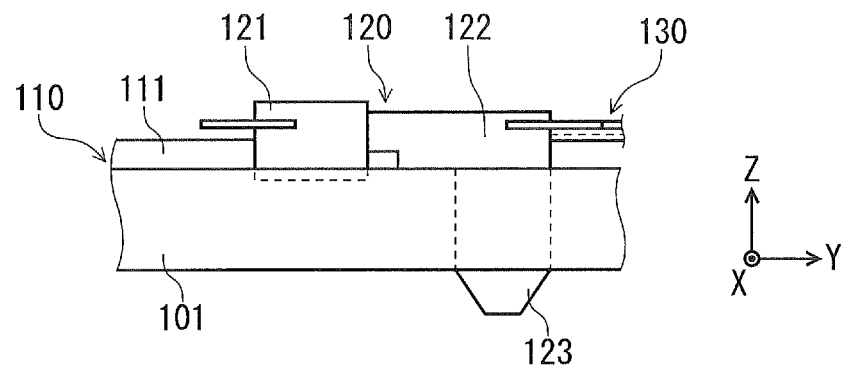
FIG. 24A is a side view of the light-emitting module shown in FIGS. 23A and 23B when seen from the x direction.
Figure 24B:
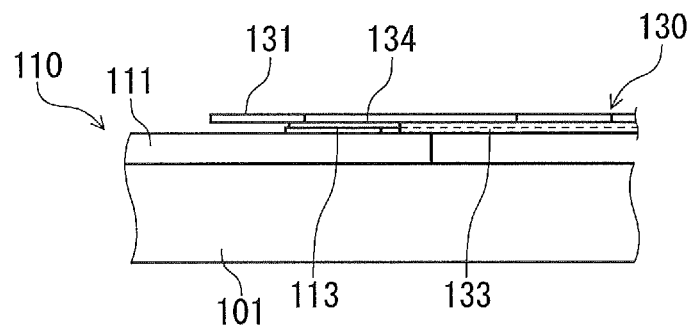
FIG. 24B is a side view illustrating a state where the connection member is removed from FIG. 24A.
Figure 24C:
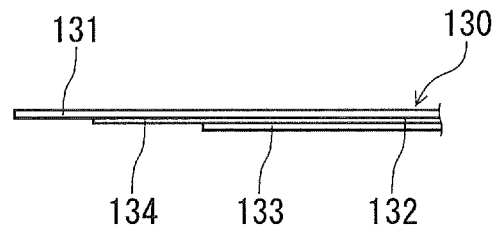
FIG. 24C is a cross-sectional view of the flexible board taken along the length direction.
Figure 25:
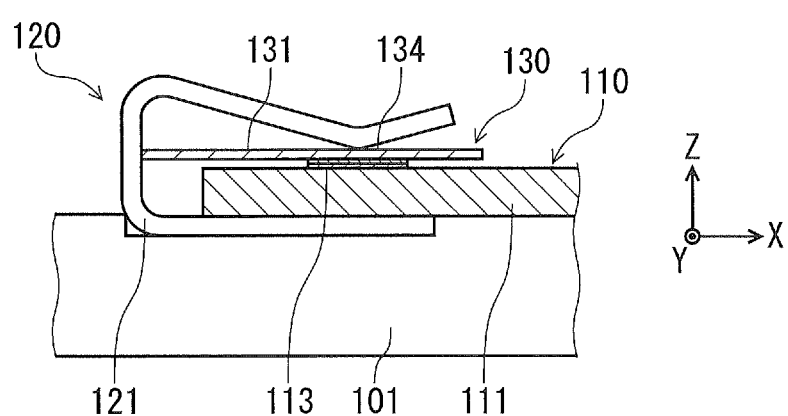
FIG. 25 is a vertical cross-sectional view of the connection member and the periphery thereof taken along line A-A of FIG. 23A.
Figure 26A:
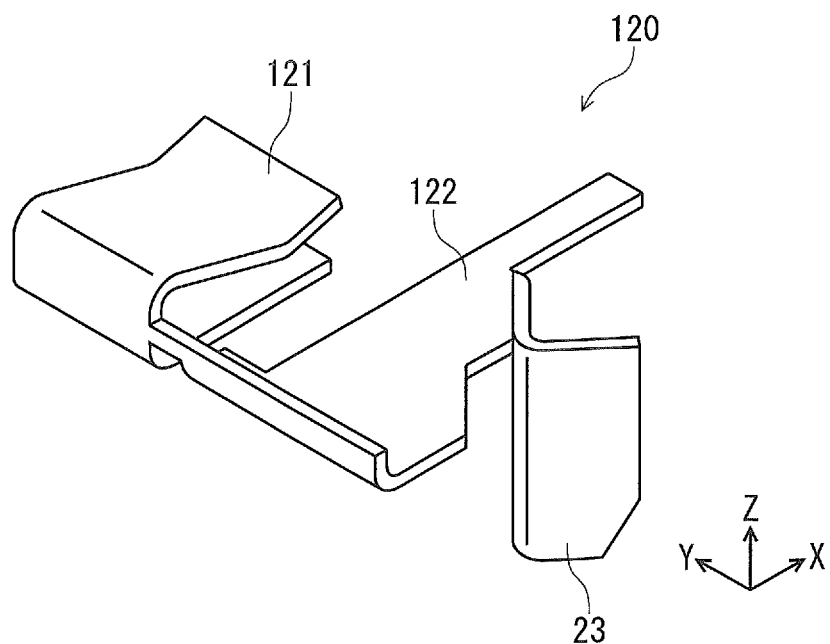
FIGS. 26A and 26B are perspective views of the connection member.
Figure 26B:
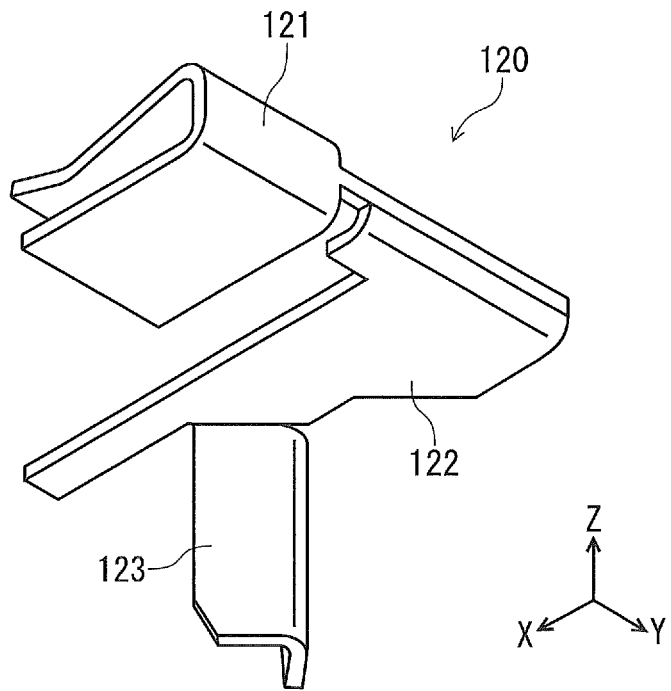

FIG. 24A is a side view of the light-emitting module 100 when seen from the x direction in FIGS. 23A and 23B and FIG. 24B is a side view illustrating a state where the connection member 120 is removed from FIG. 24A. FIG. 24C is a cross-sectional view taken along the length direction of the flexible board 130. FIG. 25 is a vertical cross-sectional view of the connection member 120 and the periphery thereof which is taken along line A-A of FIG. 23A. FIGS. 26A and 26B are perspective views of the connection member 120. The axes x, y, and z in FIGS. 23A and 23B to FIGS. 26A and 26B show the orientation relationship of the drawings.

The LED lamp 110 includes an insulating substrate 111, and a light-emitting section 112 and external electrodes 113 on the insulating substrate 111. A single or plural LED chips not shown are disposed in the light-emitting section 112, and the LED chips are sealed with a transparent sealing body. The external electrodes 113 are electrodes electrically connected to the LED chips of the light-emitting section 112, and are disposed, for example, at two corners on a diagonal of the insulating substrate 111 having a rectangular planar shape. In the two external electrodes 113, one external electrode is used as an anode and the other external electrode is used as a cathode.

A chassis 101 is, for example, a heat sink of an illuminating instrument, a reflection member, or a structural member.

The flexible board 130 is a flexible cable including a base film 131, a conductor foil 132 on the base film 131 as a conductive member, and a cover film 133 covering the conductor foil 132 other than the tip portion thereof. The tip portion of the conductor foil 132 exposed from the cover film 133 serves as an electrode portion 134. Power from the outside is supplied to the LED lamp 110 via the flexible board 130. For example, the base film 131 and the cover film 133 are formed of polyimide, and the conductor foil 132 is formed of copper or copper alloy. The flexible board 130 may be a cable or a wire other than the flexible cable.

The connection member 120 is a fixing tool which can fix the LED lamp 110 to the chassis 101 and maintaining the flexible board 130 in a state where it comes in contact with the external electrodes 113 of the LED lamp 110. The connection member 120 includes a clip portion 121, a support portion 122, and a fixing portion 123. The clip portion 121, the support portion 122, and the fixing portion 123 are preferably formed as a unified body.

The connection member 120 is formed of a metal, a resin material, and a resin material into which a metal is inserted, and has excellent high-temperature rigidity (rigidity in high-temperature environments). The connection member is preferably formed of a metal such as stainless steel, stainless steel alloy, phosphor bronze, steel, or a spring steel material having excellent high-temperature rigidity. Since the connection member 120 has excellent high-temperature rigidity, it is possible to satisfactorily fix the LED lamp 110 to the chassis 101 in spite of a rise in temperature during operation of the LED lamp 110 or the like. Accordingly, it is possible to prevent problems such as insufficient dissipation of heat from the LED lamp 110 to the chassis 101 due to a gap formed between the chassis 101 and the LED lamp 110.

The connection member 120 does not need to have high conductivity, because it is not used as a power supply path. In general, a member used as a power supply path requires inclusion of 50 wt % or more of copper for the purpose of high conductivity, but it is difficult to prepare a material including 50 wt % or more of copper and having further excellent high-temperature rigidity. In general, a material having a high copper content can be easily lowered in rigidity at high temperatures (for example, 100° C. to 150° C.).

The clip portion 121 is a holding portion holding a state where the electrode portion 134 of the flexible board 130 is in contact with the external electrode 113 of the LED lamp 110. The clip portion 121 has a clip shape and applies a force in the thickness direction (z direction) of the insulating substrate 111 with the insulating substrate 111 of the LED lamp 110 and the flexible board 130 interposed therebetween to hold them.

The support portion 122 supports the insulating substrate 111. The support portion 122 supports at least the side surface of the insulating substrate 111, but may have a shape capable of supporting the side surface and the top surface of the insulating substrate 111.

When the external electrodes 113 of the LED lamp 110 are disposed at two corners of a diagonal on the rectangular insulating substrate 111, the flexible board 130 is connected to the two external electrodes 113 and thus the connection members 120 are attached to the two corners, respectively. The support portions 122 of two connection members 120 support the peripheral side surfaces of the two corners of the insulating substrate 111, whereby the LED lamp 110 is supported on the chassis 101.

The fixing portions 123 are fixed to the chassis 101. The fixing portions 123 are, for example, protrusions to be inserted into holes 101a of the chassis 101. The respective protrusions are, for example, a protrusion having a V-shaped cross-section as shown in FIGS. 23A, 23B, 24A, 24B, 24C, 26A, and 26B, and the fixing portion 123 is fixed to the chassis 101 by the use of the elastic force thereof and the frictional force acting between the hole 101a and the inner wall. The fixing portion 123 may have a "barb", which is hooked to the edge of the rear opening of the hole 101a after being inserted into the hole 101a, at the tip thereof. The fixing portion 123 may be fixed to the chassis 101 by the use of other means such as screws or an adhesive, but is preferably a protrusion to be inserted into the hole 101a of the chassis 101 from which it can be easily detached for the purpose of easy replacement of the LED lamp 110.

The LED lamp 110 is fixed to the chassis 101 by the use of the supporting portions 122 and the fixing portions 123, and power is supplied to the LED lamp 110 via the flexible board 130 held by the clip portions 121. That is, the connection member 120 is used as a fixing tool for fixing the LED lamp 110 to the chassis 101, and the flexible board 130 is used as a power supply path to the LED lamp 110.

Figure 27A:
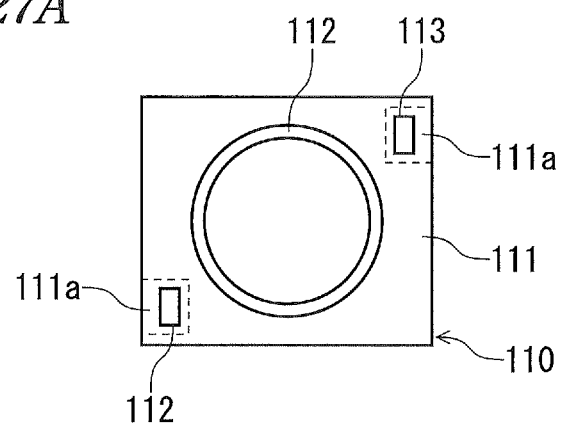
FIGS. 27A and 27B are a top view and a cross-sectional view illustrating a modification example of the light-emitting module, respectively.
Figure 27B:
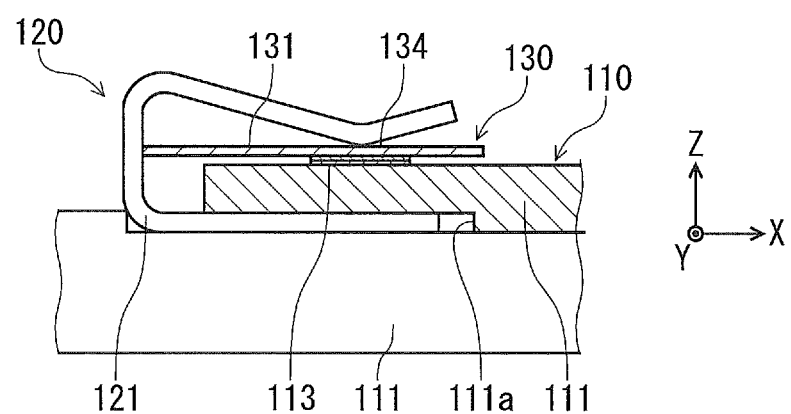

FIGS. 27A and 27B are a top view and a cross-sectional view illustrating a modification example of the LED lamp 110, respectively. The cross-section of FIG. 27B corresponds to the cross-section of FIG. 25.

The LED lamp 110 according to this modification example includes a concave portion 111a at a position of the rear surface (the surface facing the chassis 101) of the insulating substrate 111 to which the clip portion 121 is attached. In the structure shown in FIG. 25, the concave portion is formed in the chassis 101 for the purpose of housing the portion of the clip portion 121 close to the insulating substrate 111. However, in the structure shown in FIGS. 27A and 27B, since the portion of the clip portion 121 close to the insulating substrate 111 is inserted into the concave portion 111a, it is not necessary to form the concave portion in the chassis 101.

Sixth Embodiment

A sixth embodiment of the invention is different from the fifth embodiment, in the structure of the connection member. The same constituents as in the fifth embodiment will not be described or will be described in brief.

Figure 28A:
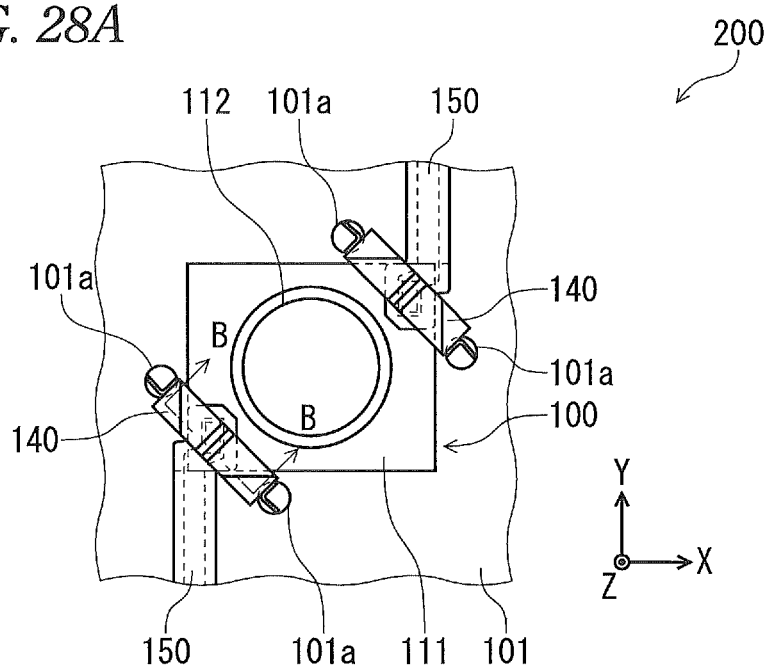
FIGS. 28A and 28B are top views of a light-emitting module according to a sixth embodiment of the invention.
Figure 28B:
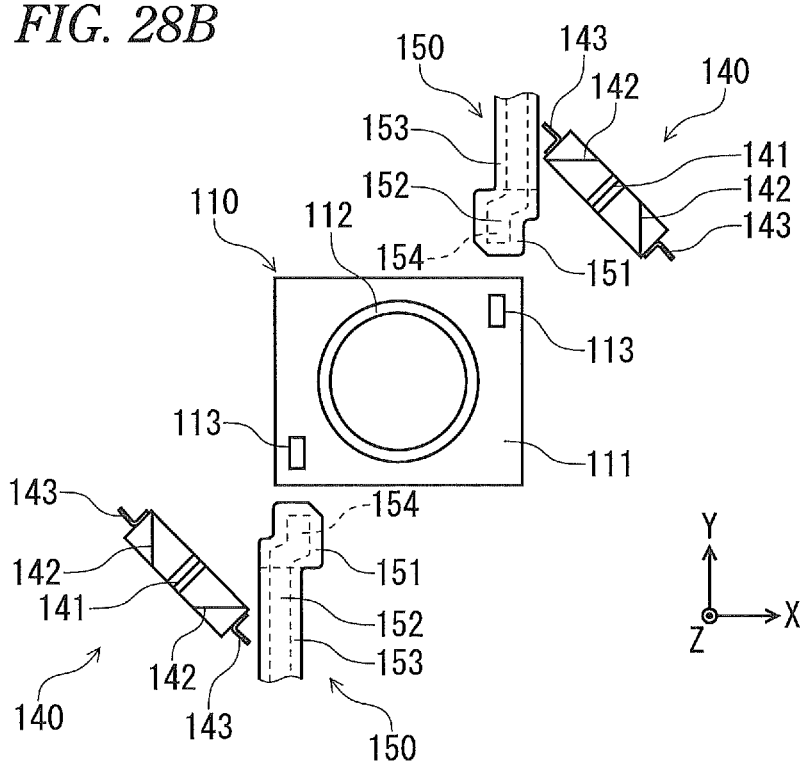

FIGS. 28A and 28B are top views of a light-emitting module 200 according to the sixth embodiment. FIG. 28A is a top view illustrating a state where the LED lamp 110 is fixed to the chassis 101 with a connection member 140, and FIG. 28B is a top view illustrating a state where the LED lamp 110, the connection member 140, and the flexible board 150 are separated.

Figure 29:
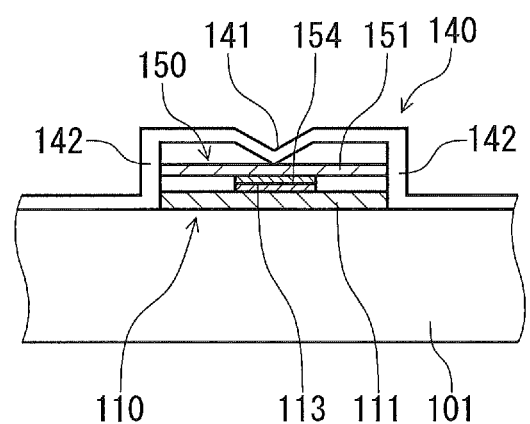
FIG. 29 is a vertical cross-sectional view of the connection member and the periphery thereof taken along line B-B of FIG. 28A.

FIG. 29 is a vertical cross-sectional view of the connection member 140 and the periphery thereof which is taken along line B-B of FIG. 28A. The axes x, y, and z in FIGS. 28A, 28B, and 29 illustrate the orientation relationship of the drawings.

The chassis 101 and the LED lamp 110 are the same as those in the fifth embodiment. The flexible board 150 includes a base film 151, a conductor foil 152 on the base film 151 as a conductive member, and a cover film 153 covering the conductor foil 152 other than the tip portion thereof, and has a shape matched with the shape of the connection member 140. The top portion of the conductor foil 152 exposed from the cover film 153 serves as an electrode portion 154.

The connection member 140 fixes the LED lamp 110 to the chassis 101, and can hold the flexible board 150 in a state where it is in contact with the external electrodes 113 of the LED lamp 110. The connection member 140 includes a pressing portion 141, a support portion 142, and a fixing portion 143. The pressing portion 141, the support portion 142, and the fixing portion 143 are preferably formed as a unified body.

The connection member 140 is formed of the same material as the connection member 120 according to the fifth embodiment, and has the same characteristics.

The pressing portion 141 is a holding portion holding a state where the electrode portion 154 of the flexible board 150 is in contact with the external electrode 113 of the LED lamp 110. The pressing portion 141 includes a protrusion having, for example, a V-shaped cross-section and presses the flexible board 150 to the LED lamp 110 by the use of the tip of the protrusion to apply a force in the thickness direction (z direction) of the insulating substrate 111, thereby holding them.

The support portion 142 supports the insulating substrate 111. The support portion 142 supports both side surfaces of a corner at the rectangular corner of the insulating substrate 111. The support portion 142 is disposed on both sides of the pressing portion 141.

The fixing portion 143 has the same structure as the fixing portion 123 of the connection member 120 according to the fifth embodiment and is fixed to the chassis 101. The fixing portion 143 is disposed outside the support portions 142 on both sides of the pressing portion 141.

The LED lamp 110 is fixed to the chassis 101 by the use of the support portions 142 and the fixing portions 143 and power is supplied to the LED lamp 110 through the use of the flexible board 150 held by the pressing portions 141. That is, the connection member 140 is used as a fixing tool fixing the LED lamp 110 to the chassis 101 and the flexible board 150 is used as a power supply path to the LED lamp 110.

Advantages of Fifth and Sixth Embodiments

According to the fifth and sixth embodiments, since the LED lamp is fixed to the chassis by the use of the connection member and power is supplied to the LED lamp through a cable (for example, the flexible board), the connection member is not used as a power supply path. Accordingly, the connection member does not need to have high conductivity and the degree of freedom in selection of a material is high. As a result, it is possible to obtain a connection member having excellent high-temperature rigidity and high reliability.

On the other hand, the cable (for example, the flexible board) does not need to have excellent high-temperature rigidity and has only to have high conductivity. Accordingly, it is possible to obtain a cable (for example, the flexible board) having a high degree of freedom in selection of a material and having high conductivity by selecting an appropriate material.

Other Embodiments

The invention is not limited to the above-mentioned embodiments, but may be embodied as follows. In these cases, it is possible to obtain operations and advantages equivalent to or more excellent than those in the above-mentioned embodiments.

(A) The sealing frame 11c or 21c may be removed from the LED lamp 11 or 21, a silicone rubber sheet having a through-hole may be placed on the insulating substrate 11a or 21a, the sealing body 11d may be injected into the through-hole of the silicone rubber sheet to seal the LED chips 11e, and then the silicone rubber sheet may be removed (see paragraphs 0023, 0025, 0082 and 0086-0097 of US 2008/0224608 A1).

In this case, by forming the highest portion of the connection member 13, 23a, 23b, 32, or 42 from the insulating substrate 11a or 21a to be lower than the highest portion of the sealing body 11d from the insulating substrate 11a or 21a, the same operations and advantages as in (2), (13), and (23) can be obtained.

(B) The surfaces of the electrode portions 12a, 12d, 22d, 31c, 31d, 134, or 154 of the flexible board 12, 22a, 22b, 31, 41, 130, or 150 may be subjected to a known dimpling process to form unevenness thereon.

In this case, since the contact resistance between the external electrodes 11f, 11g, 21f, 21g, or 113 of the LED lamp 11, 21, or 110 and the electrode portions 12a, 12d, 22d, 31c, 31d, 134, or 154 of the flexible board 12, 22a, 22b, 31, 41, 130, or 150 is reduced, it is possible to achieve more satisfactory electrical connection.

(C) A nanosilver paste may be interposed between the external electrodes 11f, 11g, 21f, 21g, or 113 of the LED lamp 11, 21, or 110 and the electrode portions 12a, 12d, 22d, 31c, 31d, 134, or 154 of the flexible board 12, 22a, 22b, 31, 41, 130, or 150.

In this case, the same operation and advantage as in (B) can be obtained.

(D) In the first, third, and fourth embodiments, the insulating substrate 11a and the light-emitting section 11b are not limited to the rotation of about 45°, but may rotate by an appropriate angle.

The insulating substrate 11a and the light-emitting section 11b may be superimposed without matching the central axes O thereof with each other.

(E) In the first, third, and fourth embodiments, the insulating substrate 11a and the sealing frame 11e are not limited to a square, but may have a quadrangular shape including a rectangular shape.

(F) In the fourth embodiment, the O ring 44 may be replaced with an appropriate pressing member.

(G) The above-mentioned embodiments may be appropriately combined. In this case, it is possible to achieve the operations and advantages of the combined embodiments or synergy effects.

The invention is not limited to the above-mentioned aspects and the above-mentioned embodiments. Various modified aspects which can be easily reached by those skilled in the art without departing from the scope of the appended claims belong to the invention. It should be understood that all the details of papers, unexamined patent publications, and examined patent publications described in this specification are incorporated therein by reference.

What is claimed is:

1. A light-emitting module comprising:
   an LED lamp comprising:
      a substrate;
      a plurality of LED chips mounted on the substrate;
      a transparent sealing body that seals the LED chips; and
      an external electrode disposed on the same plane flush with the LED chips on the substrate and that is connected to the LED chips;
   a flexible board including an electrode portion;
   a connection member that sandwiches and fixes the LED lamp and the flexible board; and
      a convex portion that protrudes downward from the connection member,
   wherein the electrode portion is pressed against the external electrode by the connection member attached to the flexible board, whereby the external electrode directly contacts and is electrically connected to the electrode portion,
   wherein a portion of the connection member highest from the substrate is lower than a portion of the sealing body highest from the substrate, and
   wherein a tip of the convex portion presses the rear side of the electrode portion of the flexible board.

2. The light-emitting module according to claim 1, wherein the connection member presses a rear side of the electrode portion of the flexible board by an elastic force of the connection member, whereby the electrode portion is urged to the external electrode due to the pressing force.

3. The light-emitting module according to claim 1, further comprising:
   a pressing member interposed between the connection member and the flexible board,
   wherein the connection member presses the rear side of the electrode portion of the flexible board through the pressing member.

4. The light-emitting module according to claim 1, further comprising:
   a sealing frame that surrounds the plurality of LED chips on the substrate,
   wherein the sealing body is filled in the sealing frame to seal the LED chips, and
   wherein a portion of the connection member highest from the substrate is lower than a portion of the sealing frame highest from the substrate.

5. The light-emitting module according to claim 1, wherein an end face of the flexible board is flush with or located inside an end face of the connection member in an outside of the LED lamp, such that the flexible board does not protrude from the connection member.

6. The light-emitting module according to claim 1, wherein the connection member comprises a metal thin plate member.

7. The light-emitting module according to claim 1, further comprising:
   a heat-dissipating member that surface-contacts a surface of the substrate opposite to a surface on which the LED chips are mounted.

8. The light-emitting module according to claim 7, wherein the flexible board further comprises a wiring pattern connected to the electrode portion,
   wherein the wiring pattern is arranged in the bent portion of the flexible board, and
   wherein the bent portion of the flexible board surface-contacts the heat-dissipating member.

9. The light-emitting module according to claim 1, wherein unevenness is formed on a surface of the electrode portion by a dimpling process.

10. The light-emitting module according to claim 1, wherein the flexible board comprises a flexible flat cable.

11. The light-emitting module according to claim 1, wherein the flexible board comprises a sheet member, and
   wherein the electrode portion is disposed in an end portion in a length direction of the flexible board.

12. The light-emitting module according to claim 1, further comprising:

a heat-dissipating member that surface-contacts a surface of the substrate opposite to a surface on which the LED chips are mounted, wherein the heat-dissipating member includes a first pair of mounting holes arranged in a straight line, and wherein the heat-dissipating member includes a second pair of mounting holes arranged in a straight line and disposed perpendicular to the straight line of the first pair of mounting holes.

13. The light-emitting module according to claim 1, wherein the convex portion protrudes downward from the connection member such that the pressing force is concentrated on the tip of the convex portion.

14. The light-emitting module according to claim 1, wherein a height of the convex portion is set in relation to a thickness of the flexible board.

15. The light-emitting module according to claim 1, further comprising:
  a plurality of locking claws which protrude from the connection member,
  wherein the plurality of locking claws contact outer peripheral ends of the substrate.

16. The light-emitting module according to claim 1, wherein the connecting member includes a mounting hole which is larger than the transparent sealing body.

17. A light-emitting module comprising:
  an LED lamp comprising:
    a substrate;
    a plurality of LED chips mounted on the substrate;
    a transparent sealing body that seals the LED chips; and
    an external electrode disposed on the same plane flush with the LED chips on the substrate and that is connected to the LED chips;
  a flexible board including an electrode portion;
  a connection member that sandwiches and fixes the LED lamp and the flexible board; and
  a convex portion that protrudes downward from the connection member, wherein the electrode portion is pressed against the external electrode by the connection member attached to the flexible board, whereby the external electrode directly contacts and is electrically connected to the electrode portion, and wherein a tip of the convex portion presses the rear side of the electrode portion of the flexible board.

18. A light-emitting module comprising:
  an LED lamp comprising:
    a substrate;
    a plurality of LED chips mounted on the substrate;
    a transparent sealing body that seals the LED chips; and
    an external electrode disposed on the same plane flush with the LED chips on the substrate and that is connected to the LED chips;
  a flexible board including an electrode portion;
  a connection member that sandwiches and fixes the LED lamp and the flexible board; and a convex portion that protrudes downward from the connection member
  a heat-dissipating member that surface-contacts a surface of the substrate opposite to a surface on which the LED chips are mounted, wherein the electrode portion is pressed against the external electrode by the connection member attached to the flexible board, whereby the external electrode directly contacts and is electrically connected to the electrode portion, wherein a portion of the connection member highest from the substrate is lower than a portion of the sealing body highest from the substrate, wherein a part of the flexible board is bent to cover a portion of the LED lamp other than the sealing body, and wherein the bent portion of the flexible board contacts the heat-dissipating member, and wherein a tip of the convex portion presses the rear side of the electrode portion of the flexible board.

\* \* \* \* \*